US012501610B2

(12) United States Patent
Lee et al.

(10) Patent No.: US 12,501,610 B2
(45) Date of Patent: Dec. 16, 2025

(54) SEMICONDUCTOR MEMORY DEVICE

(71) Applicant: Samsung Electronics Co., Ltd., Suwon-si (KR)

(72) Inventors: Hyeran Lee, Suwon-si (KR); Kiseok Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 349 days.

(21) Appl. No.: 18/189,391

(22) Filed: Mar. 24, 2023

(65) Prior Publication Data

US 2023/0413525 A1    Dec. 21, 2023

(30) Foreign Application Priority Data

May 31, 2022    (KR) .......................... 10-2022-0066919

(51) Int. Cl.
*H10B 12/00* (2023.01)
*H10D 1/68* (2025.01)

(52) U.S. Cl.
CPC ......... *H10B 12/315* (2023.02); *H10B 12/482* (2023.02); *H10B 12/488* (2023.02); *H10B 12/50* (2023.02); *H10D 1/716* (2025.01)

(58) Field of Classification Search
CPC .. H10B 12/315; H10B 12/482; H10B 12/488; H10B 12/50; H10B 12/0335; H10B 12/36; H10D 1/716; H01L 23/5283
See application file for complete search history.

(56) References Cited

U.S. PATENT DOCUMENTS

| | | |
|---|---|---|
| 9,230,612 B2 | 1/2016 | Park |
| 9,276,074 B2 | 3/2016 | Choi et al. |
| 9,379,114 B2 | 6/2016 | Jeong et al. |
| 10,566,332 B2 | 2/2020 | Wang et al. |
| 10,790,150 B2 | 9/2020 | Kim et al. |
| 10,910,261 B2 | 2/2021 | Choi et al. |
| 11,805,639 B2 | 10/2023 | Kim et al. |
| 2019/0067294 A1* | 2/2019 | Lee ...................... H10B 12/315 |

(Continued)

FOREIGN PATENT DOCUMENTS

| | | |
|---|---|---|
| KR | 100234350 B1 | 12/1999 |
| TW | 202220143 A | 5/2022 |

*Primary Examiner* — Yasser A Abdelaziz
(74) *Attorney, Agent, or Firm* — Wolf, Greenfield & Sacks, P.C.

(57) ABSTRACT

A semiconductor memory includes a substrate having a plurality of active regions, a plurality of word lines formed in the substrate and disposed in a plurality of word line trenches extending in a first direction, a plurality of cell pad patterns on the plurality of active regions, a plurality of bit line structures formed on the substrate and extending in a second direction perpendicular to the first direction, and a plurality of isolation insulating patterns filling at least a portion of a plurality of isolation trenches extending between the plurality of cell pad patterns in the second direction, wherein each of the plurality of isolation insulating patterns includes an isolation insulating line portion and an isolation insulating spacer portion connected to each other and forming an integral body. The isolation insulating line portion and the isolation insulating spacer portion being disposed in alternating ones of the plurality of isolation trenches and extend in the second direction.

20 Claims, 39 Drawing Sheets

(56) References Cited

U.S. PATENT DOCUMENTS

| | | | |
|---|---|---|---|
| 2022/0139836 A1* | 5/2022 | Son | H10B 12/09 |
| | | | 257/296 |
| 2022/0181330 A1* | 6/2022 | Seong | H10B 12/315 |
| 2023/0225113 A1* | 7/2023 | Na | H10B 12/0335 |
| | | | 257/306 |

* cited by examiner

SEMICONDUCTOR MEMORY DEVICE

CROSS-REFERENCE TO RELATED APPLICATION

This application is based on and claims priority under 35 U.S.C. § 119 to Korean Patent Application No. 10-2022-0066919, filed on May 31, 2022, in the Korean Intellectual Property Office, the disclosure of which is incorporated by reference herein in its entirety.

BACKGROUND

The inventive concept relates to semiconductor memory devices, and, more particularly, to semiconductor memory devices having a capacitor structure.

The electronics industry is developing rapidly, and to meet the needs of users, electronic devices are becoming smaller and lighter. A high degree of integration is desired for semiconductor memory devices used in electronic devices, so the design rules for the structures of the semiconductor memory devices have been reduced, and fine structures have been achieved.

SUMMARY

The inventive concept provides a semiconductor memory device for which the manufacturing process is simplified while ensuring reliability.

Embodiments of the inventive concept provide a semiconductor memory device as follows. According to an aspect of the inventive concept, there is provided a semiconductor memory device including a substrate having a plurality of active regions, a plurality of word lines formed in the substrate and disposed in a plurality of word line trenches extending in a first direction, a plurality of cell pad patterns on the plurality of active regions, a plurality of bit line structures formed on the substrate and extending in a second direction perpendicular to the first direction, and a plurality of isolation insulating patterns filling at least a portion of a plurality of isolation trenches extending between the plurality of cell pad patterns in the second direction, wherein each of the plurality of isolation insulating patterns comprises an isolation insulating line portion having a line shape and an isolation insulating spacer portion having a ring shape connected to each other and forming an integral body, the isolation insulating line portion and the isolation insulating spacer portion being disposed in alternating ones of the plurality of isolation trenches and extending in the second direction.

According to another aspect of the inventive concept, there is provided a semiconductor memory device including a substrate having a plurality of active regions, a plurality of word lines formed in the substrate and disposed in a plurality of word line trenches extending in a first direction and a plurality of buried insulating layers on the plurality of word lines, a plurality of cell pad patterns on the plurality of active regions, an insulating layer pattern on the plurality of buried insulating layers and the plurality of cell pad patterns, a plurality of isolation insulating patterns filling at least a portion of a plurality of isolation trenches extending in a second direction perpendicular to the first direction between the plurality of cell pad patterns and the insulating layer pattern, a plurality of bit line structures formed on the substrate and extending in the second direction, a plurality of direct contact conductive patterns between the plurality of bit line structures and the plurality of active regions, wherein lower portions of the plurality of direct contact conductive patterns are located in the plurality of isolation trenches, respectively, wherein, each of the plurality of isolation insulating patterns comprises an isolation insulating line portion having a line shape and an isolation insulating spacer portion having a ring shape connected to each other and forming an integral body, the isolation insulating line portion and the isolation insulating spacer portion being disposed in alternating ones of the plurality of isolation trenches and extending in the second direction, and wherein the plurality of isolation insulating spacer portions at least partially surround the plurality of direct contact conductive patterns, respectively.

According to another aspect of the inventive concept, there is provided a semiconductor memory device including a substrate having a plurality of active regions, a plurality of word lines formed in the substrate and disposed in a plurality of word line trenches extending in a first direction and a plurality of buried insulating layers on the plurality of word lines, a plurality of cell pad patterns on the plurality of active regions, an insulating layer pattern on the plurality of buried insulating layers and the plurality of cell pad patterns, a plurality of isolation insulating patterns filling at least a portion of a plurality of isolation trenches extending in a second direction perpendicular to the first direction between the plurality of cell pad patterns and the insulating layer pattern, a plurality of bit line structures formed on the substrate and extending in the second direction, a plurality of direct contact conductive patterns between the plurality of bit line structures and the plurality of active regions, wherein lower portions of the plurality of direct contact conductive patterns are located in the plurality of isolation trenches, respectively, a plurality of landing pads in contact with the plurality of cell pad patterns and extending to an upper portion of any one of the two adjacent bit line structures among the plurality of bit line structures, and a plurality of capacitor structures including a plurality of lower electrodes in contact with the plurality of landing pads, an upper electrode, and a capacitor dielectric layer interposed between the plurality of lower electrodes and the upper electrodes, wherein each of the plurality of isolation insulating patterns comprises an isolation insulating line portion having a line shape and an isolation insulating spacer portion having a ring shape connected to each other and forming an integral body, the isolation insulating line portion and the isolation insulating spacer portion being disposed in alternating ones of the plurality of isolation trenches and extending in the second direction, wherein the plurality if isolation insulating spacer portions at least partially surround the plurality of direct contact conductive patterns, respectively, and wherein the plurality of cell pad patterns are separated and insulated from each other by the plurality of buried insulating layers and the plurality of isolation insulating patterns.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
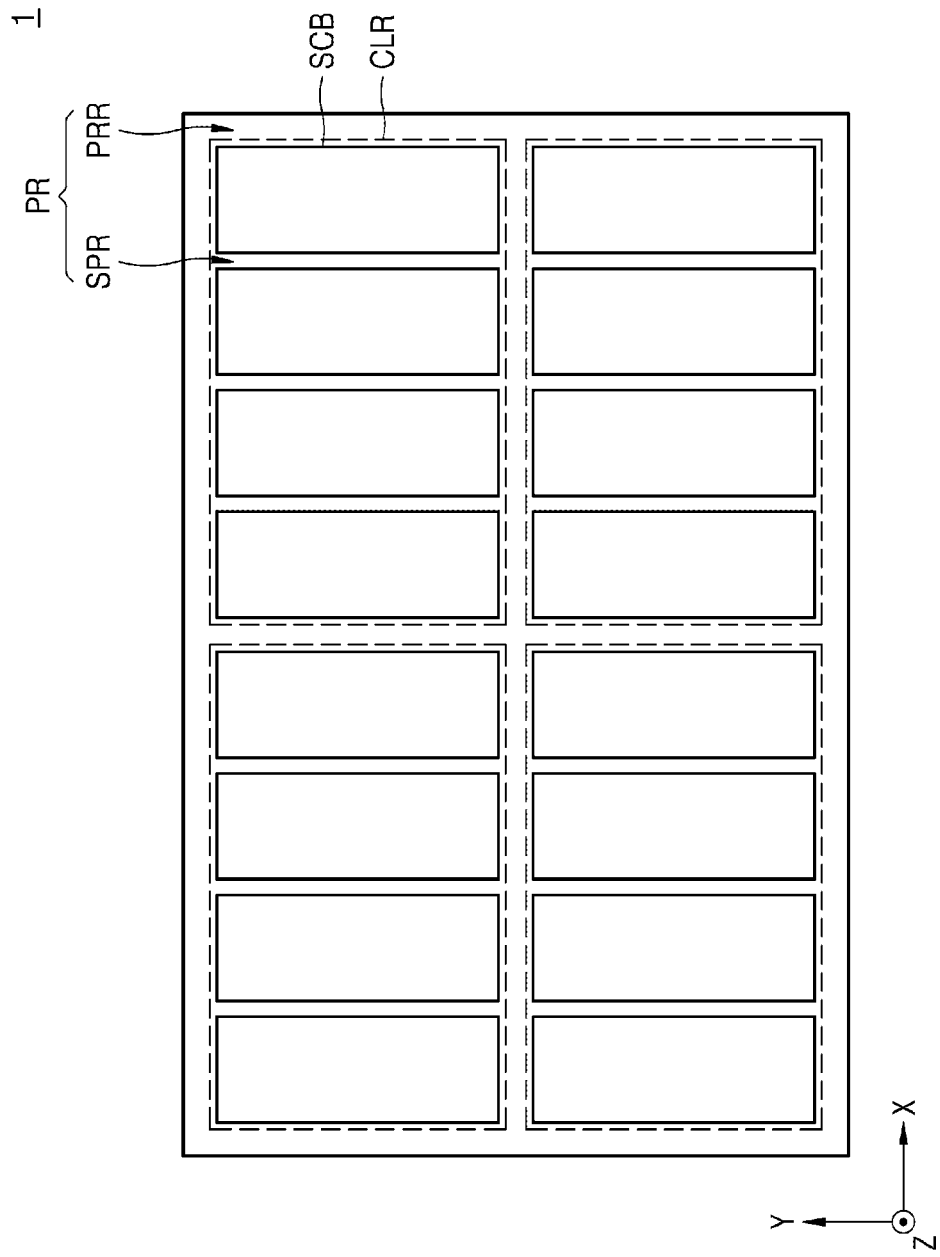
FIG. 1 is a block diagram illustrating a semiconductor memory device according to some embodiments.

Hereinafter, example embodiments of the present inventive concept will be described with reference to the accompanying drawings. The present inventive subject matter may, however, be embodied in many different forms and should not be construed as limited to the embodiments set forth herein. In the drawings, like numerals refer to like elements throughout the description and repeated descriptions may be omitted. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

FIG. 1 is a block diagram illustrating a semiconductor memory device according to some embodiments.

Referring to FIG. 1, a semiconductor memory device 1 may include a cell region CLR in which memory cells are disposed and a main peripheral region PRR bordering or surrounding the cell region CLR.

According to an embodiment, the cell region CLR may include sub-peripheral regions SPR that divide cell blocks SCB. A plurality of memory cells may be disposed in the cell blocks SCB. In this specification, the cell block SCB refers to a region in which the memory cells are regularly arranged with generally uniform spacing, and the cell block SCB may be referred to as a sub-cell block.

Logic cells for communicating an electrical signal to/from the memory cells may be disposed in the main peripheral region PRR and the sub peripheral region SPR. In some embodiments, the main peripheral region PRR may be called a peripheral circuit region, and the sub peripheral region SPR may be called a core circuit region. The peripheral region PR may include a main peripheral region PRR and sub peripheral regions SPR. That is, the peripheral region PR may be a core and peripheral circuit region, including the peripheral circuit region and the core circuit region. In some embodiments, at least a portion of the sub-peripheral region SPR may be provided only as a space for dividing the cell blocks SCB. For example, the cell blocks SCB may be the regions shown in FIGS. 2 to 16B.

Figure 2:
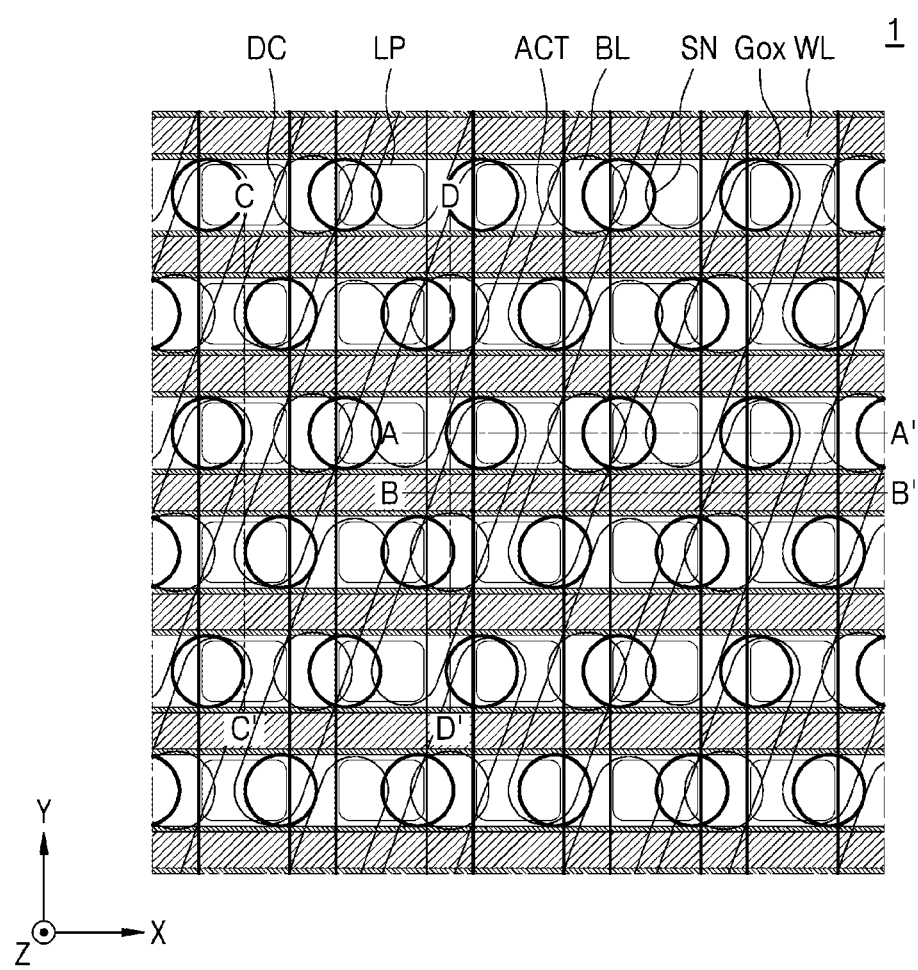
FIG. 2 is a schematic plan layout illustrating main components of a semiconductor memory device according to some embodiments.

FIG. 2 is a schematic plan layout illustrating main components of a semiconductor memory device according to some embodiments.

The semiconductor memory device 1 may include a plurality of active regions ACT formed in a memory cell region CR. In some embodiments, the plurality of active regions ACT disposed in the memory cell region CR may be disposed to have long axes in a diagonal direction with respect to a first horizontal direction (X direction) and a second horizontal direction (Y direction) that are orthogonal to each other. The plurality of active regions ACT may constitute a plurality of active regions 118 illustrated in FIGS. 3A to 16B.

The plurality of word lines WL may extend in parallel to each other in the first horizontal direction (X direction) across the plurality of active regions ACT. A plurality of gate dielectric layers Gox may be interposed between the plurality of active regions ACT and the plurality of word lines WL. In some embodiments, the plurality of gate dielectric layers Gox may at least partially cover side surfaces and bottom surfaces of the plurality of word lines WL and extend parallel to each other in the first horizontal direction (X direction).

A plurality of bit lines BL may extend parallel to each other in the second horizontal direction (Y direction) crossing the first horizontal direction (X direction) on the plurality of word lines WL. A plurality of landing pads LP may extend from between two adjacent bit lines BL among the plurality of bit lines BL to an upper portion of any one bit line BL of the two adjacent bit lines BL. In some embodiments, the plurality of landing pads LP may be arranged in a line in each of the first horizontal direction (X direction) and the second horizontal direction (Y direction).

A plurality of storage nodes SN may be respectively formed on the plurality of landing pads LP. The plurality of storage nodes SN may be respectively formed on the plurality of bit lines BL. Each of the plurality of storage nodes SN may be a lower electrode of a plurality of capacitors. The storage node SN may be connected to the active region ACT through the landing pad LP.

FIGS. 3A to 3D are cross-sectional views illustrating semiconductor memory devices according to some embodiments. In detail, FIGS. 3A, 3B, 3C, and 3D are cross-sectional views taken along lines A-A', B-B', C-C', and D-D' of FIG. 2, respectively.

Referring to FIGS. 3A to 3D together, a semiconductor memory device 1 includes a plurality of active regions 118 defined by a device isolation layer 116 and a plurality of cell pad patterns XL, and includes a substrate 110 having a plurality of word line trenches 120T crossing the plurality of active regions 118, a plurality of word lines 120 disposed inside the plurality of word line trenches 120T, a plurality of bit line structures 140, and a plurality of capacitor structures 200 including a plurality of lower electrodes 210, a capacitor dielectric layer 220, and an upper electrode 230.

The substrate 110 may include, for example, silicon (Si), crystalline Si, polycrystalline Si, and/or amorphous Si. In some other embodiments, the substrate 110 may include a semiconductor element, such as germanium (Ge) or at least one compound semiconductor, such as silicon germanium (SiGe), silicon carbide (SiC), gallium arsenide (GaAs), indium arsenide (InAs), and/or indium phosphide (InP). In some embodiments, the substrate 110 may have a silicon on insulator (SOI) structure. For example, the substrate 110 may include a buried oxide layer (BOX). The substrate 110 may include a conductive region, for example, a well doped with an impurity or a structure doped with an impurity.

The plurality of active regions 118 may be a portion of the substrate 110 defined by a device isolation trench 116T. The plurality of active regions 118 may have a relatively long island shape having a minor axis and a major axis in a plan view. In some embodiments, the plurality of active regions 118 may be disposed to have long axes in a diagonal direction with respect to the first horizontal direction (X direction) and the second horizontal direction (Y direction). The plurality of active regions 118 may have substantially the same length and extend along the major axis, and may be repeatedly arranged with a substantially constant pitch. The plurality of active regions 118 may constitute the plurality of active regions ACT illustrated in FIG. 2.

The device isolation layer 116 may at least partially fill the device isolation trench 116T. A plurality of active regions 118 may be defined on the substrate 110 by the device isolation layer 116.

In some embodiments, the device isolation layer 116 may include a triple layer including a first device isolation layer, a second device isolation layer, and a third device isolation layer, but embodiments are not limited thereto. For example, the first device isolation layer may conformally at least partially cover an inner surface and a bottom surface of the device isolation trench 116T. For example, the second device isolation layer may conformally at least partially cover the first device isolation layer. For example, the third device isolation layer may at least partially cover the second device isolation layer and at least partially fill the device isolation trench 116T. In some embodiments, the device isolation layer 116 may be configured as a single layer composed of one type of insulating layer, a double layer composed of two types of insulating layers, or a multilayer composed of a combination of at least four types of insulating layers.

A plurality of cell pad patterns XL may be disposed on the device isolation layer 116 and the plurality of active regions 118. In some embodiments, a pair of cell pad patterns XL spaced apart from each other may be disposed on one active region 118. For example, each of the pair of cell pad patterns XL spaced apart from another may be disposed on both sides of the active region 118 in the long axis direction. The plurality of cell pad patterns XL may at least partially cover the device isolation layer 116 and the plurality of active regions 118. The plurality of cell pad patterns XL may include Si, Ge, W, WN, Co, Ni, Al, Mo, Ru, Ti, TiN, Ta, TaN, Cu, or a combination thereof. For example, the plurality of cell pad patterns XL may include polysilicon.

The plurality of word line trenches 120T may be formed in the substrate 110 including the plurality of active regions 118 defined by the device isolation layer 116 and the plurality of cell pad patterns XL. The plurality of word line trenches 120T may extend in a first horizontal direction (X-direction) parallel to each other, and may each have a line shape that crosses the active region 118 and is disposed to be substantially equally spaced in the second horizontal direction (Y direction). In some embodiments, a step may be formed on the bottom surface of the plurality of word line trenches 120T.

A plurality of gate dielectric layers 122, a plurality of word lines 120, and a plurality of buried insulating layers 124 may be sequentially formed in the plurality of word line trenches 120T. The plurality of word lines 120 may respectively constitute the plurality of word lines WL illustrated in FIG. 2. The plurality of word lines 120 may extend in a first horizontal direction (X-direction) in parallel, and cross the active region 118, and may each have a line shape that crosses the active region 118 and is disposed to be substantially equally spaced in the second horizontal direction (Y direction). An upper surface of each of the plurality of word lines 120 may be positioned at a lower vertical level than the upper surface of the substrate 110. A bottom surface of the plurality of word lines 120 may have a concave-convex shape, and a saddle fin transistor (saddle FinFET) may be formed in the plurality of active regions 118.

As used herein, the level or vertical level means a height in a direction (Z direction) perpendicular to a main surface or an upper surface of the substrate 110. That is, positioning at the same level or constant level means a position in which the height in the vertical direction (Z direction) with respect to the main or upper surface of the substrate 110 is the same or constant, and positioning at the low/high vertical level means a position in which the height in the vertical direction (Z direction) with respect to the main surface of the substrate 110 is low/high.

The plurality of word lines 120 may at least partially fill a lower portion of the plurality of word line trenches 120T. Each of the plurality of word lines 120 may have a stacked structure of a lower word line layer 120a and an upper word line layer 120b. For example, the lower word line layer 120a may conformally at least partially cover the bottom surface and a lower portion of the inner wall of the word line trench 120T. The bottom surface and the lower portion of the inner wall of the word line trench 120T and the lower word line layer 120a are spaced apart from each other via the gate dielectric layer 122. For example, the upper word line layer 120b may at least partially cover the lower word line layer 120a, may at least partially fill a portion of the word line trench 120T. A portion of the inner wall of the word line trench 120T and the upper word line layer 120b are spaced apart from each other via the gate dielectric layer 122. In some embodiments, the lower word line layer 120a may be formed of a metal material, such as Ti, TiN, Ta, and/or TaN, and/or a conductive metal nitride. In some embodiments, the upper word line layer 120b may be formed of, for example, doped polysilicon, a metal material, such as W, a conductive metal nitride, such as WN, TiSiN, or WSiN, or a combination thereof.

In portions of the active region 118 of the substrate 110 on both sides of the plurality of word lines 120, a source region and a drain region may be disposed, which are formed by implanting impurity ions into the portion of the active region 118.

The gate dielectric layer 122 may at least partially cover an inner wall and a bottom surface of the word line trench 120T. The plurality of gate dielectric layers 122 may constitute the plurality of gate dielectric layers Gox illustrated in FIG. 2. In some embodiments, the gate dielectric layer 122 may extend from between the word line 120 and the word line trench 120T to between the buried insulating layer 124 and the word line trench 120T. The gate dielectric layer 122 may be formed of one or more materials including, but not limited to, silicon oxide, silicon nitride, silicon oxynitride, oxide/nitride/oxide (ONO), and/or a high-k dielectric material having a higher dielectric constant than silicon oxide. For example, the gate dielectric layer 122 may have a dielectric constant of about 10 to 25. In some embodiments, the gate dielectric layer 122 may be formed of one or more materials including, but not limited to, hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and/or lead scandium tantalum oxide (PbScTaO). For example, the gate dielectric layer 122 may be formed of $HfO_2$, $Al_2O_3$, $HfAlO_3$, Ta2O3, and/or $TiO_2$.

The plurality of buried insulating layers 124 may respectively at least partially cover the plurality of word lines 120 and may respectively at least partially fill upper portions of the plurality of word line trenches 120T. Accordingly, the plurality of buried insulating layers 124 may extend parallel to each other in the first horizontal direction (X direction). In some embodiments, the upper surfaces of the plurality of buried insulating layers 124 may be positioned at substantially the same vertical level as the upper surfaces of the plurality of cell pad patterns XL. The buried insulating layer 124 may be formed of one or more materials including, but not limited to, silicon oxide, silicon nitride, silicon oxynitride, and combinations thereof. For example, the buried insulating layer 124 may be made of silicon nitride.

Figure 10:
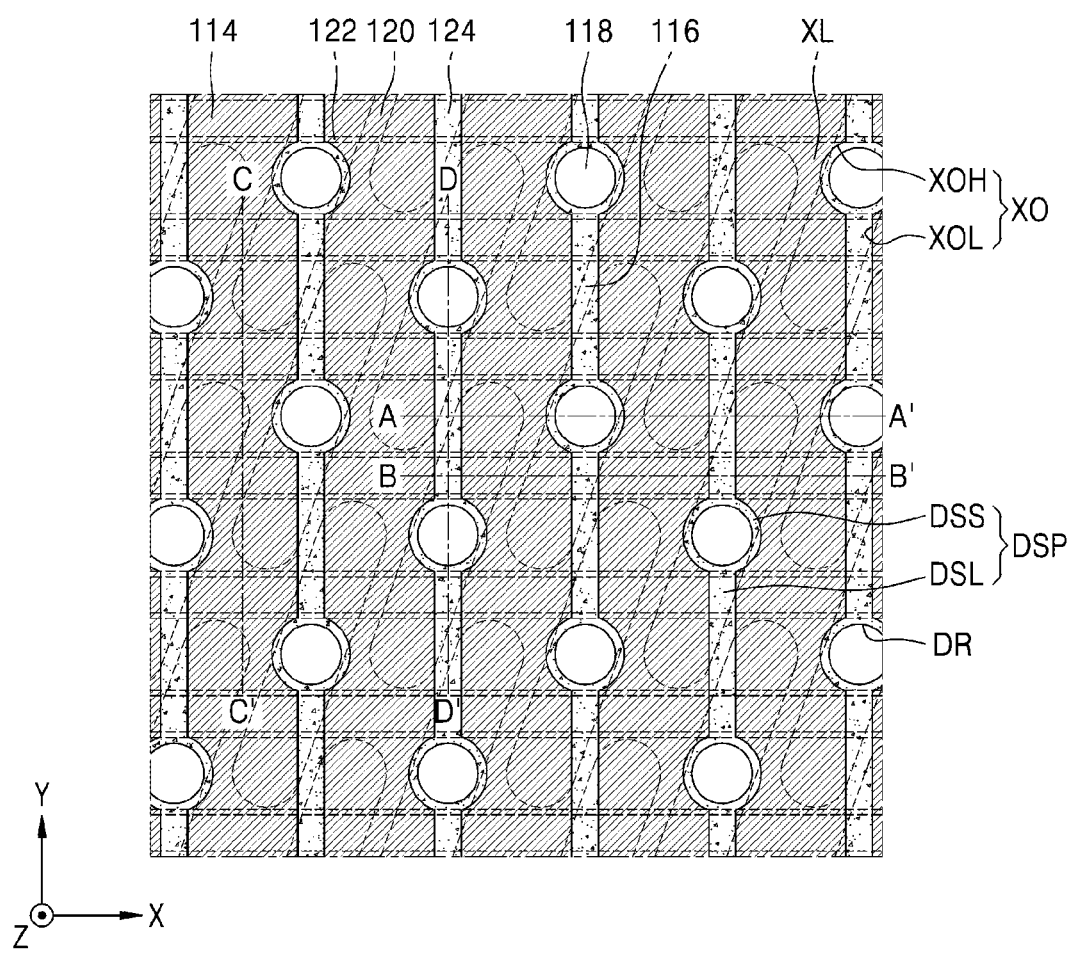
FIG. 10 is a plan layout illustrating a method of manufacturing a semiconductor memory device according to some embodiments.
Figure 11A:
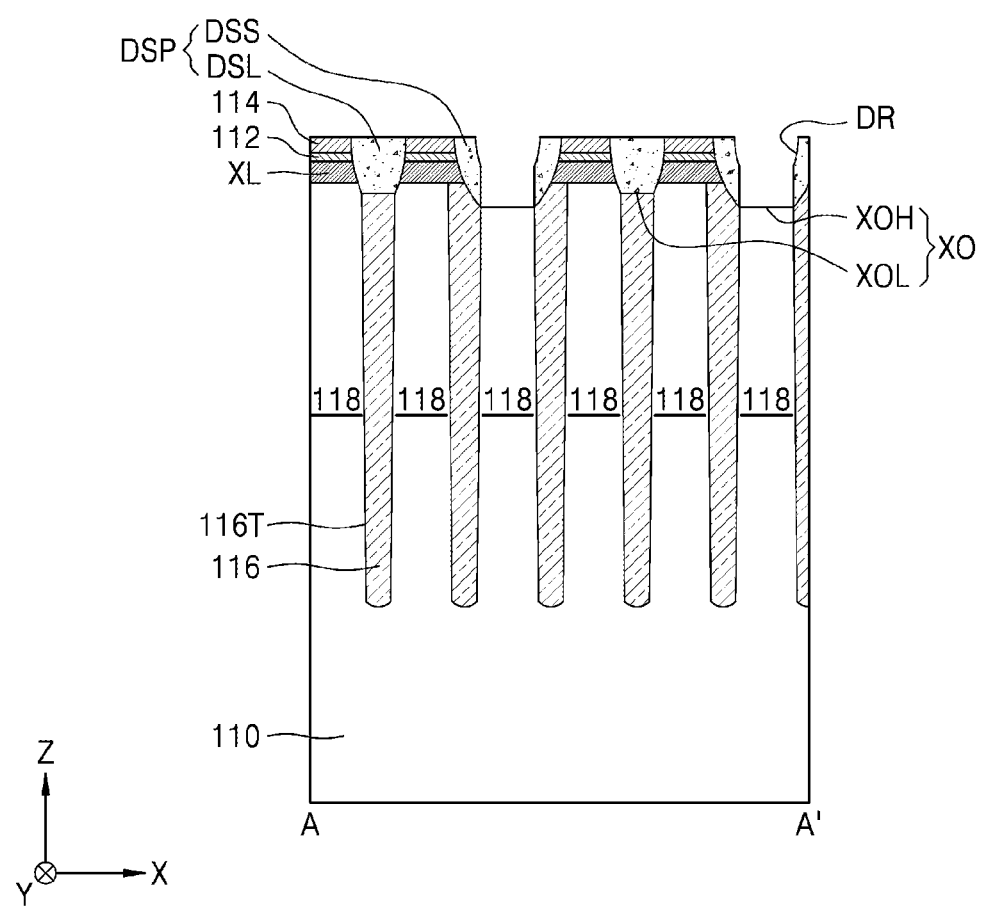
FIGS. 11A to 11D are cross-sectional views illustrating a method of manufacturing a semiconductor memory device according to some embodiments.
Figure 11B:
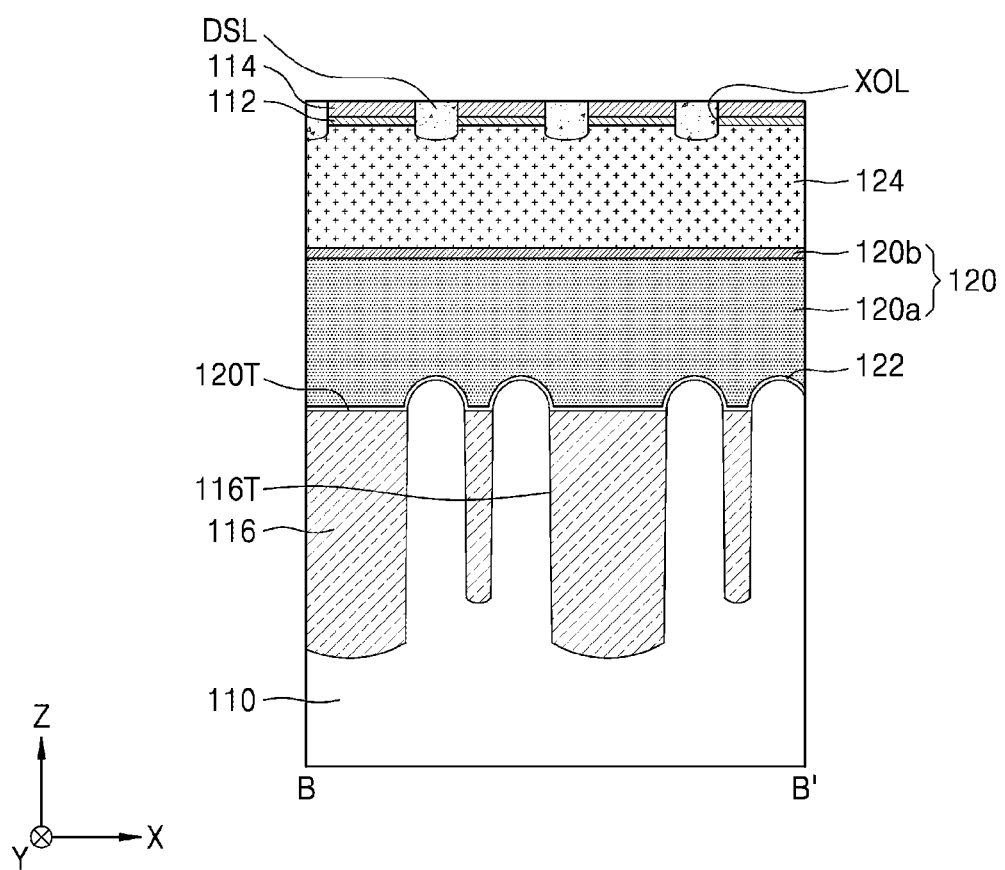
Figure 11C:
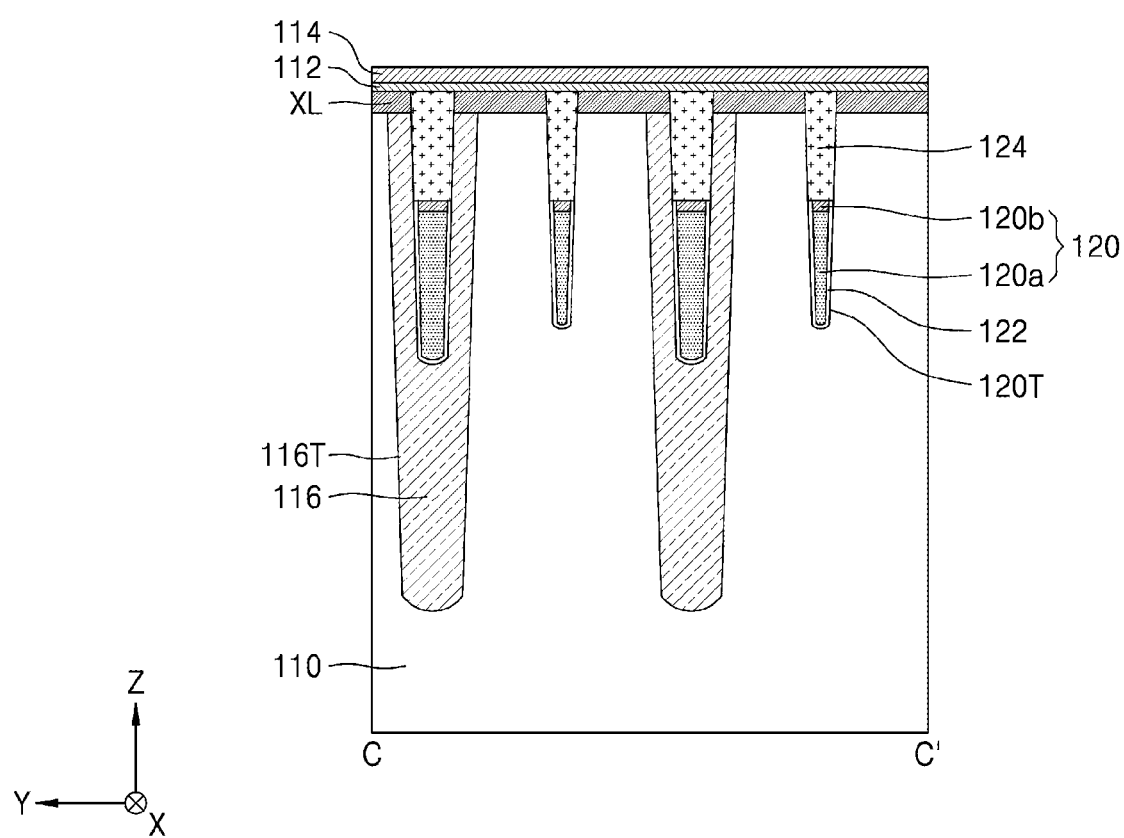
Figure 11D:
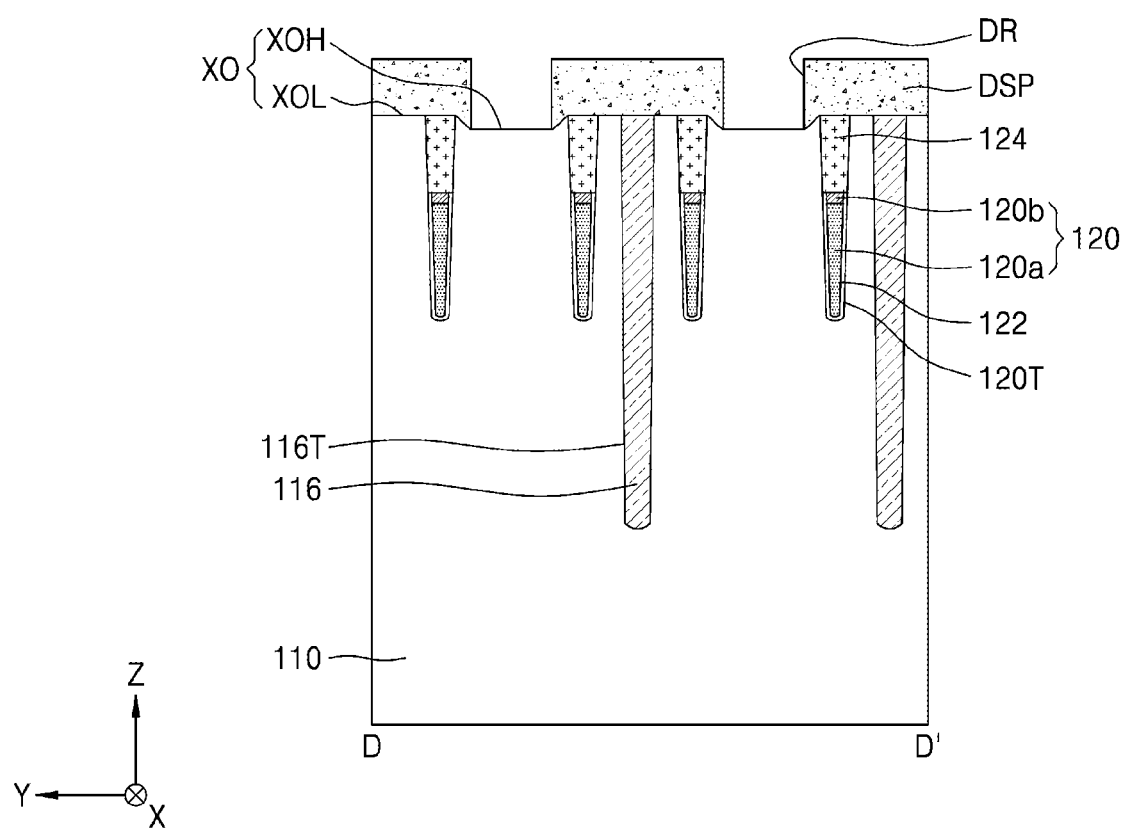

Referring to FIG. 10 together with FIGS. 2, 3A, 3B, 3C, and 3D, the plurality of cell pad patterns XL may have a matrix arrangement arranged in a line in each of the first horizontal direction (X direction) and the second horizontal direction (Y direction). The plurality of cell pad patterns XL may be separated and insulated from each other by the plurality of buried insulating layers 124 extending in a first horizontal direction (X direction) and a plurality of isolation insulating patterns DSP filling at least a portion of a plurality of isolation trenches XO extending in a second horizontal direction (Y direction). The plurality of isolation trenches XO may extend in the second horizontal direction (Y direction) between the plurality of cell pad patterns XL.

A plurality of insulating layer patterns may be disposed on the plurality of cell pad patterns XL and the plurality of buried insulating layers 124. In some embodiments, each of the plurality of insulating layer patterns may have a stacked structure including a first insulating layer pattern 112 and a second insulating layer pattern 114. In some embodiments, the second insulating layer pattern 114 may be thicker than the first insulating layer pattern 112. For example, the first insulating layer pattern 112 may have a thickness of about 50 Å to about 90 Å, and the second insulating layer pattern 114 is thicker than the first insulating layer pattern 112, and may have a thickness of about 60 Å to about 100 Å.

In the plurality of isolation trenches XO, in a top-view, a line trench portion XOL having a line shape extending in a second horizontal direction (Y direction) and a hole trench portion XOH having a circular shape may communicate with each other and be alternately disposed in the second horizontal direction (Y direction). That is, the line trench portion XOL and the hole trench portion XOH are disposed in every other isolation trench XO in a line in the second horizontal direction. A device isolation layer 116, a plurality of active regions 118, and a plurality of buried insulating layers 124 may be exposed on a bottom surface of the plurality of isolation trenches XO.

On the bottom surface of the hole trench portion XOH, the active region 118 may be exposed relatively more than the device isolation layer 116 and the buried insulating layer 124. The cell pad pattern XL, the first insulating layer pattern 112, and the second insulating layer pattern 114 may be at least partially exposed on sidewalls of the plurality of isolation trenches XO. In the first horizontal direction (X direction), the width of the hole trench portion XOH may be greater than the width of the line trench portion XOL. In some embodiments, the bottom surface of the hole trench portion XOH may be positioned at a lower vertical level than the bottom surface of the line trench portion XOL. That is, a depth of the hole trench portion XOH among the isolation trenches XO may be greater than a depth of the line trench portion XOL.

The isolation insulating pattern DSP may include an isolation insulating line portion DSL at least partially filling the line trench portion XOL and an isolation insulating spacer portion DSS at least partially covering the sidewall of the hole trench portion XOH. In the isolation insulating pattern DSP, the isolation insulating line portion DSL having a line shape extending in the second horizontal direction (Y direction) in a plane shape and the isolation insulating spacer portion DSS having a ring shape are connected to each other in the second horizontal direction (Y direction) and may be alternately disposed. In the first horizontal direction (X direction), the width of the outer edge of the isolation insulating spacer portion DSS may be greater than the width of the isolation insulating line portion DSL. The isolation insulating line portion DSL and the isolation insulating spacer portion DSS may be connected to each other and form an integral or monolithic body. In some embodiments, the upper surface of the isolation insulating pattern DSP and the upper surface of the second insulating layer pattern 114 may be located at the same vertical level to form a coplanar surface.

The isolation insulating line portion DSL may be interposed between the cell pad patterns XL adjacent in the first horizontal direction (X direction) to separate them to be insulated from each other. The isolation insulating spacer portion DSS may at least partially cover the cell pad pattern XL, the first insulating layer pattern 112, and the second insulating layer pattern 114 exposed on sidewalls of the plurality of isolation trenches XO. The isolation insulating spacer portion DSS at least partially surrounds a portion of the direct contact conductive pattern 134 positioned in the hole trench portion XOH, that is, a lower portion of the direct contact conductive pattern 134, to separate the direct contact conductive pattern 134 to be insulated from the adjacent cell pad pattern XL. The isolation insulating spacer portion DSS on the sidewall of the hole trench portion XOH may have a thickness equal to or greater than ½ of the width of the line trench portion XOL and less than ½ of the width of the hole trench portion XOH in the first horizontal direction (X direction).

In some embodiments, the plurality of isolation insulating patterns DSP may be formed using an extreme ultraviolet (EUV) lithography process. For example, the plurality of isolation trenches XO may be formed through an etching process using a mask pattern formed by an EUV lithography process as an etching mask, and the plurality of isolation insulating patterns DSP may be formed to fill at least a portion of the plurality of isolation trenches XO. The isolation insulating line portion DSL and the isolation insulating spacer portion DSS included in each of the plurality of isolation insulating patterns DSP may be formed using a single EUV lithography process without using a separate photolithography process.

In some embodiments, each of the plurality of cell pad patterns XL may have a substantially rectangular shape in a plan view. For example, each of the plurality of cell pad patterns XL may have a rectangular shape in which one of the four sides is concave in a plane. In a plan view, each of both sides of the cell pad pattern XL in the second horizontal direction (Y direction) may be in a straight line shape that is in contact with the buried insulating layer 124 and extends in the first horizontal direction (X direction). In a plan view, one side of both sides in the first horizontal direction (X direction) of the cell pad pattern XL may be in a straight line shape that is in contact with the isolation insulating line portion DSL and extends in the second horizontal direction (Y direction), and the other side may be an arc shape that is in contact with the isolation insulating spacer portion DSS and concaves into the cell pad pattern XL.

The plurality of direct contact conductive patterns 134 may pass through the second insulating layer pattern 114 and the first insulating layer pattern 112 to fill a portion of the hole trench portion XOH exposing the source region in the active region 118. In some embodiments, the hole trench portion XOH may extend into the active region 118, that is, into the source region. The direct contact conductive pattern 134 may be formed of, for example, doped polysilicon. In some embodiments, the direct contact conductive pattern 134 may include an epitaxial silicon layer. The plurality of direct contact conductive patterns 134 may respectively constitute the plurality of direct contacts DC illustrated in FIG. 2.

A plurality of bit line structures 140 may be disposed on the second insulating layer pattern 114. Each of the plurality of bit line structures 140 may include a bit line 147 and an insulating capping line 148 at least partially covering the bit line 147. The plurality of bit line structures 140 may extend in a second horizontal direction (Y direction) parallel to the main surface of the substrate 110 in parallel to each other. The plurality of bit lines 147 may respectively constitute the plurality of bit lines BL illustrated in FIG. 2. The plurality of bit lines 147 may be electrically connected to the plurality of active regions 118 through the plurality of direct contact conductive patterns 134. In some embodiments, a bit line structure 140 may further include a conductive semiconductor pattern 132 disposed between the second insulating layer pattern 114 and the bit line 147. The conductive semiconductor pattern 132 may be formed of, for example, doped polysilicon.

The plurality of isolation insulating patterns DSP may extend in the second horizontal direction (Y direction) under the plurality of bit lines 147 and the plurality of bit line structures 140 including the plurality of bit lines. The plurality of isolation insulating patterns DSP and the plurality of bit lines 147, or the plurality of isolation insulating patterns DSP and the plurality of bit line structures 140 may at least partially overlap each other in the vertical direction (Z direction).

The plurality of cell pad patterns XL may be disposed on the plurality of active regions 118 with each of the plurality of bit line structures 140 including the plurality of bit lines 147 therebetween. The plurality of cell pad patterns XL may be disposed on the plurality of active regions 118 with each of the plurality of word lines 120 therebetween. That is, the plurality of cell pad patterns XL may be disposed on the plurality of active regions 118 in the first horizontal direction (X direction) with each of the plurality of word lines 120 therebetween, and may have a matrix arrangement disposed on the plurality of active regions 118 in the second horizontal direction (Y direction) with each of the plurality of bit line structures 140 therebetween.

The bit line 147 may have a stacked structure of a line-shaped first metal-based conductive pattern 145 and a second metal-based conductive pattern 146. In some embodiments, the first metal-based conductive pattern 145 may be formed of titanium nitride (TiN) and/or Ti—Si—N (TSN), and the second metal-based conductive pattern 146 may be formed of tungsten (W) or tungsten and tungsten silicide (WSix). In some embodiments, the first metal-based conductive pattern 145 may function as a diffusion barrier. In some embodiments, the plurality of insulating capping lines 148 may be formed of silicon nitride.

A plurality of insulating spacer structures 150 may at least partially cover both sidewalls of the plurality of bit line structures 140. Each of the plurality of insulating spacer structures 150 may include a first insulating spacer 152, a second insulating spacer 154, and a third insulating spacer 156. In some embodiments, the plurality of insulating spacer structures 150 may extend into the hole trench portion XOH to cover both sidewalls of the plurality of direct contact conductive patterns 134. The second insulating spacer 154 may be made of a material having a lower dielectric constant than that of the first insulating spacer 152 and the third insulating spacer 156. In some embodiments, the first insulating spacer 152 and the third insulating spacer 156 may be made of nitride, and the second insulating spacer 154 may be made of oxide. In some embodiments, the first insulating spacer 152 and the third insulating spacer 156 may be made of nitride, and the second insulating spacer 154 may be made of a material having an etch selectivity with respect to the first insulating spacer 152 and the third insulating spacer 156. For example, the first insulating spacer 152 and the second insulating spacer 156 may be made of nitride, and the second insulating spacer 154 may be an air spacer. In some embodiments, an insulating spacer structure 150 may include a second insulating spacer 154 made of oxide and a third insulating spacer 156 made of nitride.

Each of a plurality of insulating fences 180 may be interposed in a space between a pair of insulating spacer structures 150 facing each other between a pair of adjacent bit line structures 140. The plurality of insulating fences 180 may be spaced apart from each other and arranged in a line along between the pair of insulating spacer structures 150 facing each other, that is, along the second horizontal direction (Y direction). For example, the plurality of insulating fences 180 may be made of nitride.

In some embodiments, the plurality of insulating fences 180 may be formed to penetrate or extend through the second insulating layer pattern 114 and the first insulating layer pattern 112 and extend into the buried insulating layer 124, but embodiments are not limited thereto. In some other embodiments, the plurality of insulating fences 180 may penetrate or extend into the second insulating layer pattern 114 and the first insulating layer pattern 112 but not extend into the buried insulating layer 124, may extend into the second insulating layer pattern 114 but not penetrate or extend into the first insulating layer pattern 112, may penetrate or extend into the second insulating layer pattern 114 and extend into the first insulating layer pattern 112 but not pass through the first insulating layer pattern 112, or may not extend into the second insulating layer pattern 114. In other embodiments, the plurality of insulating fences 180 may not extend into the second insulating layer pattern 114, and lower surfaces of the plurality of insulating fences 180 may be in contact with the upper surface of the second insulating layer pattern 114.

Between each of the plurality of bit lines 147, a plurality of contact holes 170H may be defined between the plurality of insulating fences 180. The plurality of contact holes 170H and the plurality of insulating fences 180 may be alternately disposed between a pair of insulating spacer structures 150 facing each other among the plurality of insulating spacer structures 150 at least partially covering both sidewalls of the plurality of bit line structures 140, that is, along the second horizontal direction (Y direction). An inner space of the plurality of contact holes 170H may be defined by an insulating spacer structure 150 at least partially covering sidewalls of each of the two adjacent bit lines 147, an insulating fence 180, and a cell pad pattern XL between two adjacent bit lines 147 among the plurality of bit lines 147. In some embodiments, each of the plurality of contact holes 170H may extend from between the insulating spacer structure 150 and the insulating fence 180 into the cell pad pattern XL on the active region 118.

A plurality of landing pads 190 may respectively at least partially fill the plurality of contact holes 170H to be in contact with the plurality of cell pad patterns XL and extend onto the plurality of bit line structures 140. The plurality of landing pads 190 may be separated from each other with a recess portion 190R therebetween. Each of the plurality of landing pads 190 may include a conductive barrier layer and a conductive pad material layer on the conductive barrier layer. For example, the conductive barrier layer may be formed of a metal, a conductive metal nitride, or a combination thereof. In some embodiments, the conductive barrier layer may have a Ti/TiN stack structure. In some embodiments, the conductive pad material layer may include tungsten (W). In some embodiments, a metal silicide layer may be formed between the landing pad 190 and the cell pad pattern XL. The metal silicide layer may be formed of cobalt silicide (CoSix), nickel silicide (NiSix), and/or manganese silicide (MnSix), but embodiments are not limited thereto.

The plurality of landing pads 190 may be respectively connected to the plurality of active regions 118 through the plurality of cell pad patterns XL. The plurality of landing pads 190 may respectively constitute the plurality of landing pads LP illustrated in FIG. 2.

Figure 3A:
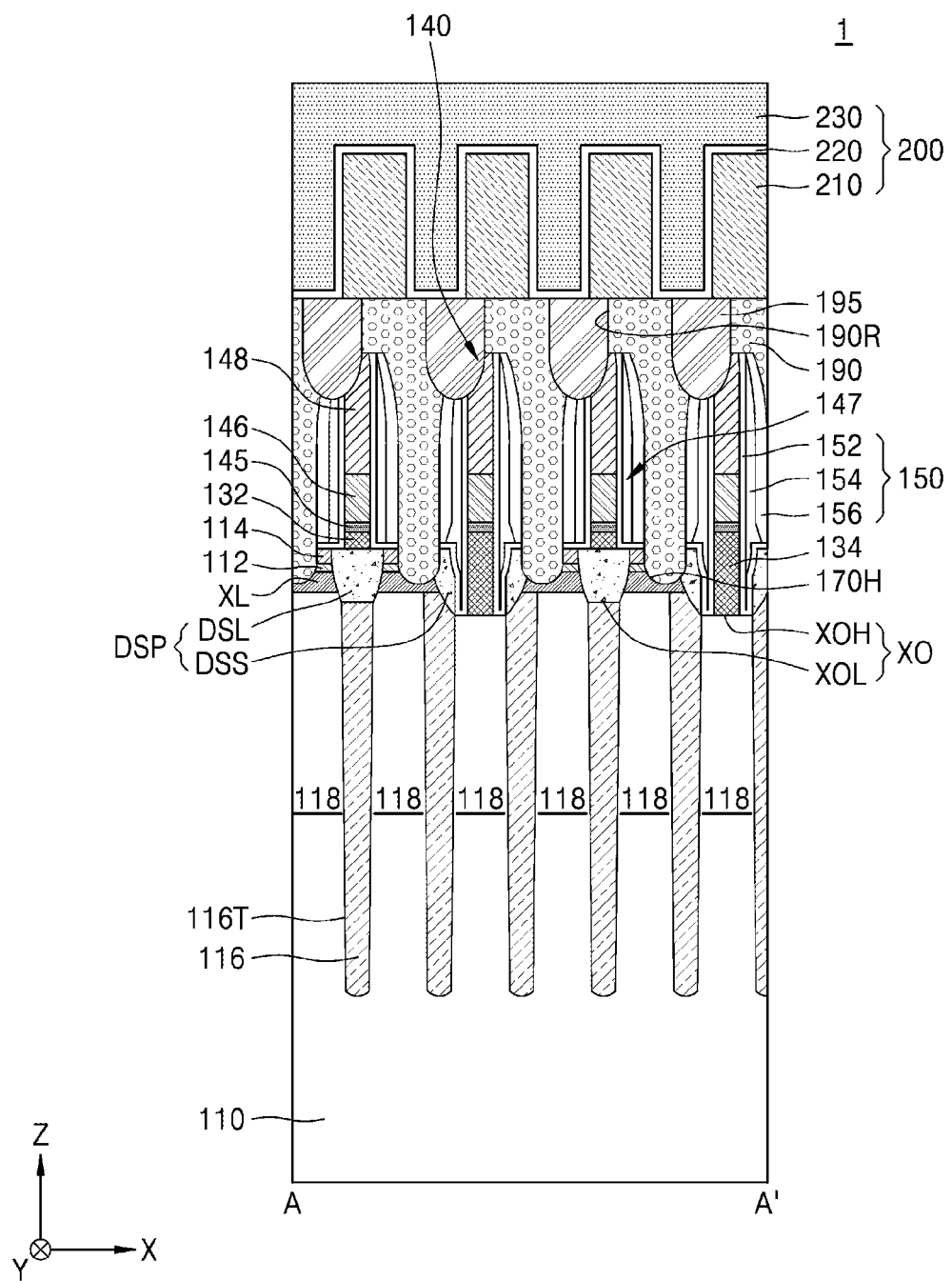
FIGS. 3A to 3D are cross-sectional views illustrating semiconductor memory devices according to some embodiments.
Figure 3B:
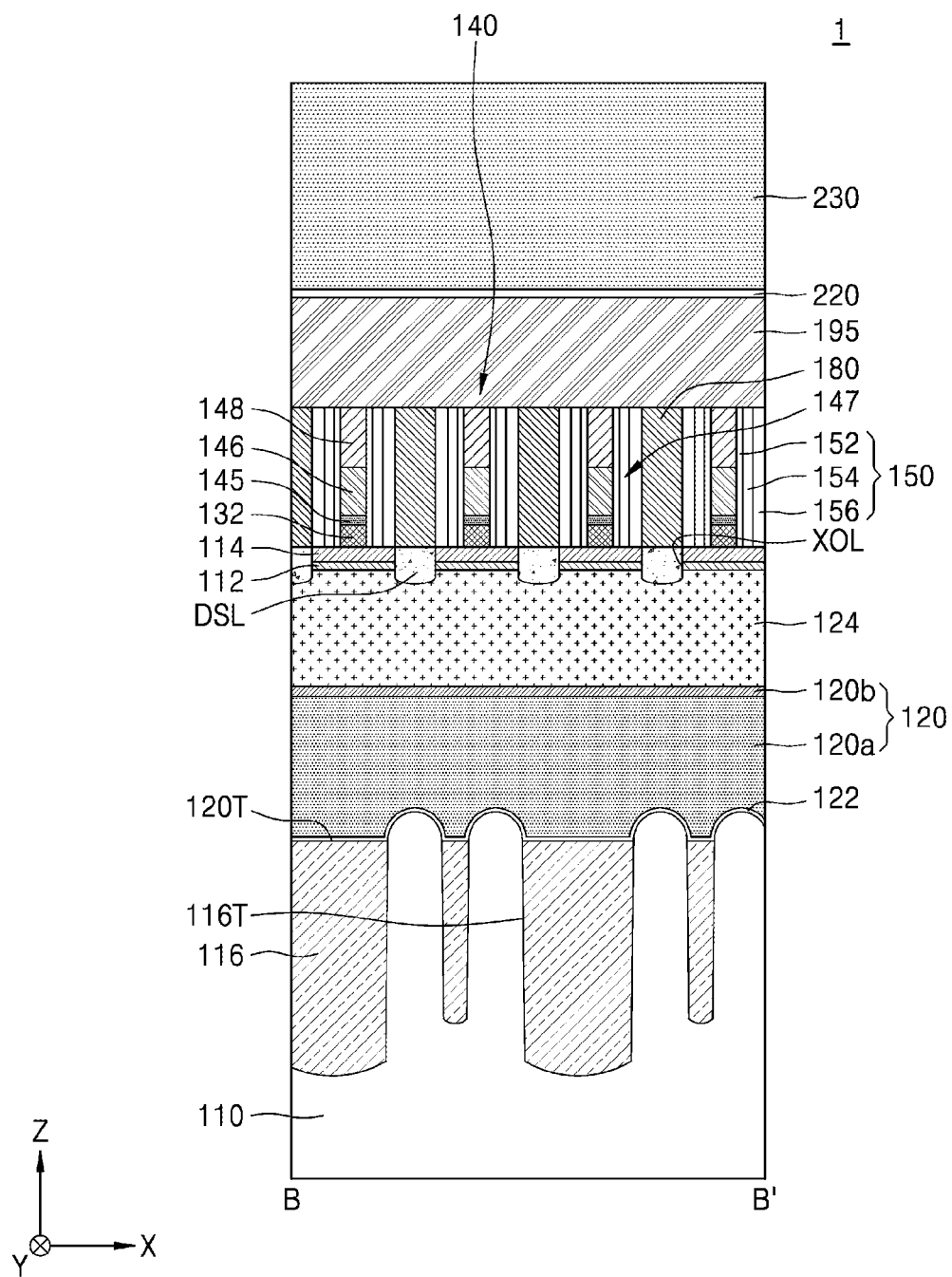
Figure 3C:
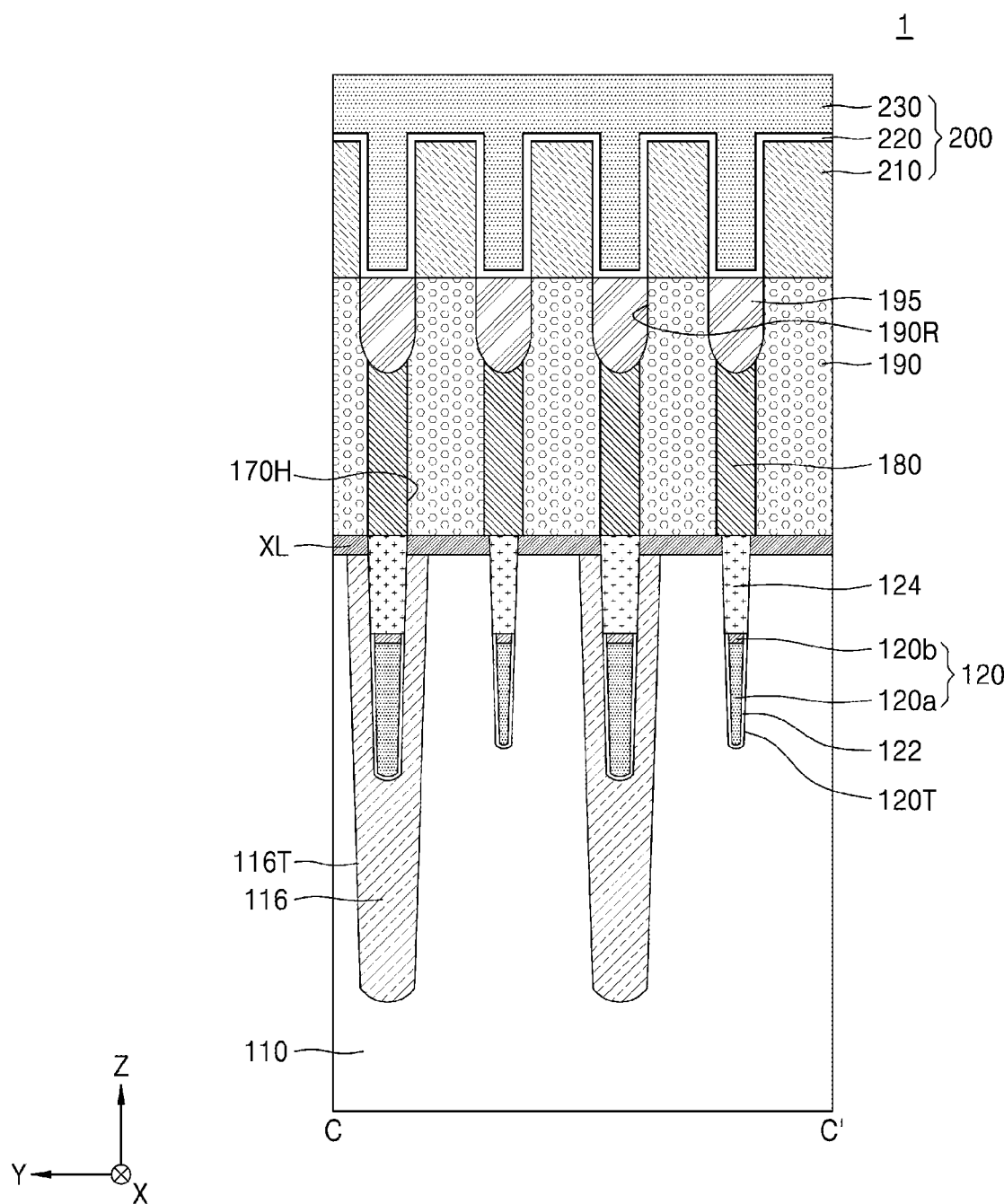
Figure 3D:
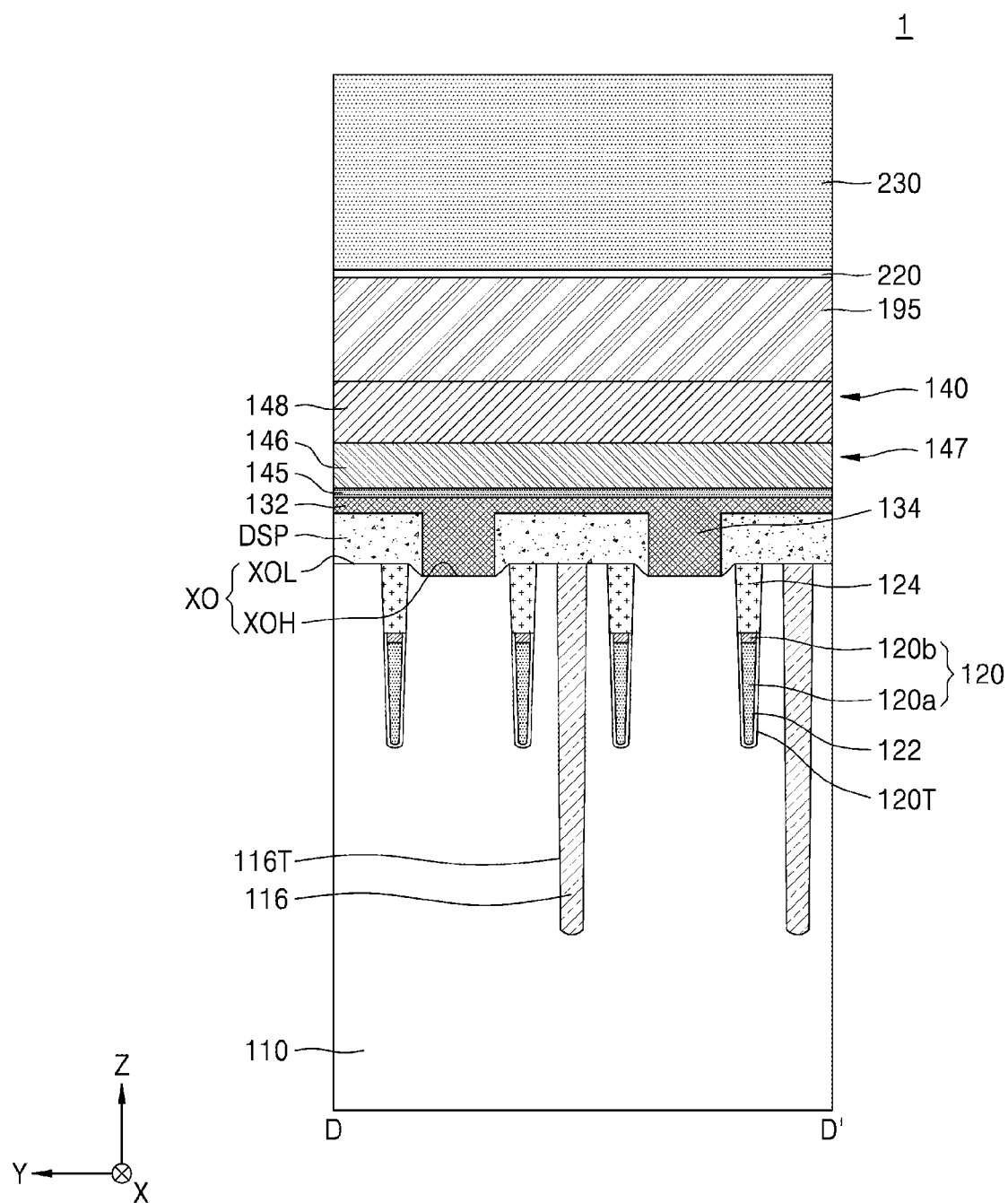

The recess portion 190R may be at least partially filled by an insulating structure 195. In some embodiments, the insulating structure 195 may include an interlayer insulating layer and an etch stop layer. For example, the interlayer insulating layer may be formed of an oxide, and the etch stop layer may be formed of a nitride. In FIGS. 3A and 3C, the upper surface of the insulating structure 195 is illustrated as being positioned at the same vertical level as the upper surface of the plurality of landing pads 190, but embodiments of the inventive concept are not limited thereto. For example, the insulating structure 195 may have an upper surface positioned at a vertical level higher than the upper surface of the plurality of landing pads 190 by at least partially filling the recess portion 190R and at least partially covering the upper surfaces of the plurality of landing pads 190.

A plurality of capacitor structures 200 including a plurality of lower electrodes 210, a capacitor dielectric layer 220, and an upper electrode 230 may be disposed on the plurality of landing pads 190 and the insulating structure 195. The plurality of lower electrodes 210 may respectively contact the plurality of landing pads 190. The lower electrode 210 and the landing pad 190 corresponding to each other may be electrically connected to each other.

The capacitor dielectric layer 220 may conformally at least partially cover the surfaces of the plurality of lower electrodes 210. In some embodiments, the capacitor dielectric layer 220 may be integrally formed to at least partially cover the surfaces of the plurality of lower electrodes 210 together in a predetermined region, for example, within one cell block (SCB in FIG. 1). The plurality of lower electrodes 210 may respectively constitute the plurality of storage nodes SN illustrated in FIG. 2.

Each of the plurality of lower electrodes 210 may have a columnar shape, that is, a pillar shape, in which the inside of each lower electrode is at least partially filled to have a circular horizontal cross-section, but embodiments are not limited thereto. In some embodiments, each of the plurality of lower electrodes 210 may have a cylindrical shape with a closed lower portion thereof. In some embodiments, the plurality of lower electrodes 210 may be arranged in a honeycomb shape arranged in a zigzag pattern with respect to the first horizontal direction (X direction) or the second horizontal direction (Y direction). In some other embodiments, the plurality of lower electrodes 210 may be arranged in a matrix form arranged in a line in each of the first horizontal direction (X direction) and the second horizontal direction (Y direction). The plurality of lower electrodes 210 may include a metal doped with impurities, such as silicon, tungsten, or copper, or a conductive metal compound, such as titanium nitride. In FIGS. 3A and 3C, the upper surface of the insulating structure 195 is shown to be positioned at the same vertical level as the lower surface of the lower electrode 210, but embodiments of the inventive concept are not limited thereto.

The capacitor dielectric layer 220 may be formed of, for example, TaO, TaAlO, TaON, AlO, AlSiO, HfO, HfSiO, ZrO, ZrSiO, TiO, TiAlO, BST((Ba,Sr)TiO), STO(SrTiO), BTO(BaTiO)·), PZT(Pb(Zr,Ti)O), (Pb,La)(Zr,Ti)O, Ba(Zr, Ti)O, Sr(Zr,Ti)O, or a combination thereof.

The upper electrode 230 may have a stacked structure of one or at least two of a doped semiconductor material layer, a main electrode layer, and an interface layer. The doped semiconductor material layer may include, for example, doped polysilicon and/or doped polycrystalline silicon germanium (SiGe). The main electrode layer may be made of a metal material. The main electrode layer may be formed of, for example, W, Ru, RuO, Pt, PtO, Ir, SRO(SrRuO), BSRO((Ba,Sr)RuO), CRO(CaRuO), BaRuO, La(Sr,Co) O, and/or the like. In some embodiments, the main electrode layer may be made of W. The interfacial layer may include one or more materials, such as, but not limited to, a metal oxide, a metal nitride, a metal carbide, and/or a metal silicide.

In the semiconductor memory device 1 according to embodiments of the inventive concept, because the cell pad pattern XL is interposed between the landing pad 190 and the active region 118, the contact area between the landing pad 190 and the active region 118 is increased to ensure reliability. In addition, because the isolation insulating line portion DSL that insulates adjacent cell pad patterns XL from each other and the isolation insulating spacer portion DSS that insulates the adjacent direct contact conductive pattern 134 and the cell pad pattern XL from each other may be formed using a single EUV lithography process, a process of manufacturing the semiconductor memory device may be simplified.

Figure 4:
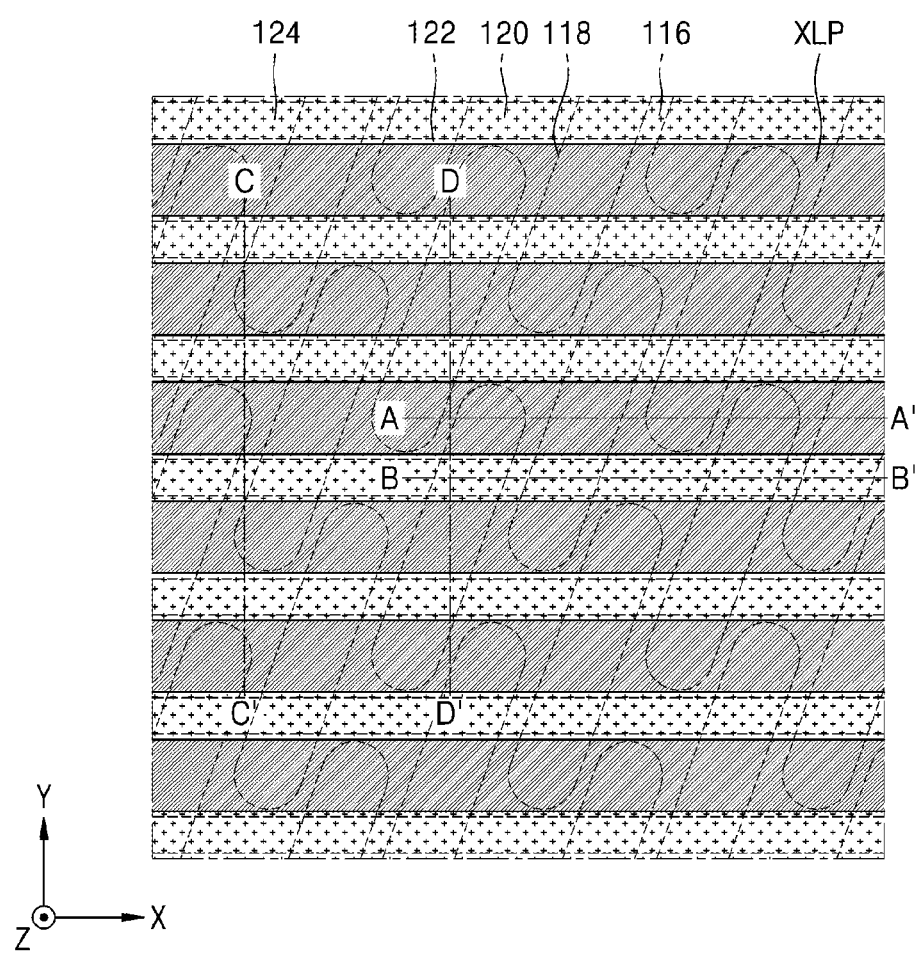
FIG. 4 is a plan layout illustrating a method of manufacturing a semiconductor memory device according to some embodiments.
Figure 5A:
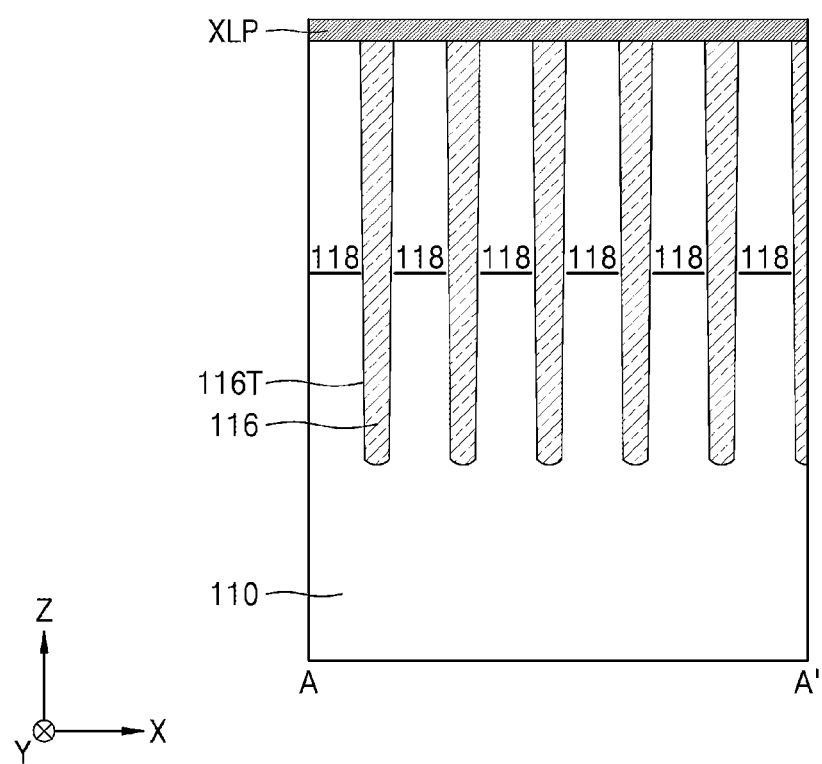
FIGS. 5A to 5D are cross-sectional views illustrating a method of manufacturing a semiconductor memory device, according to some embodiments.
Figure 5B:
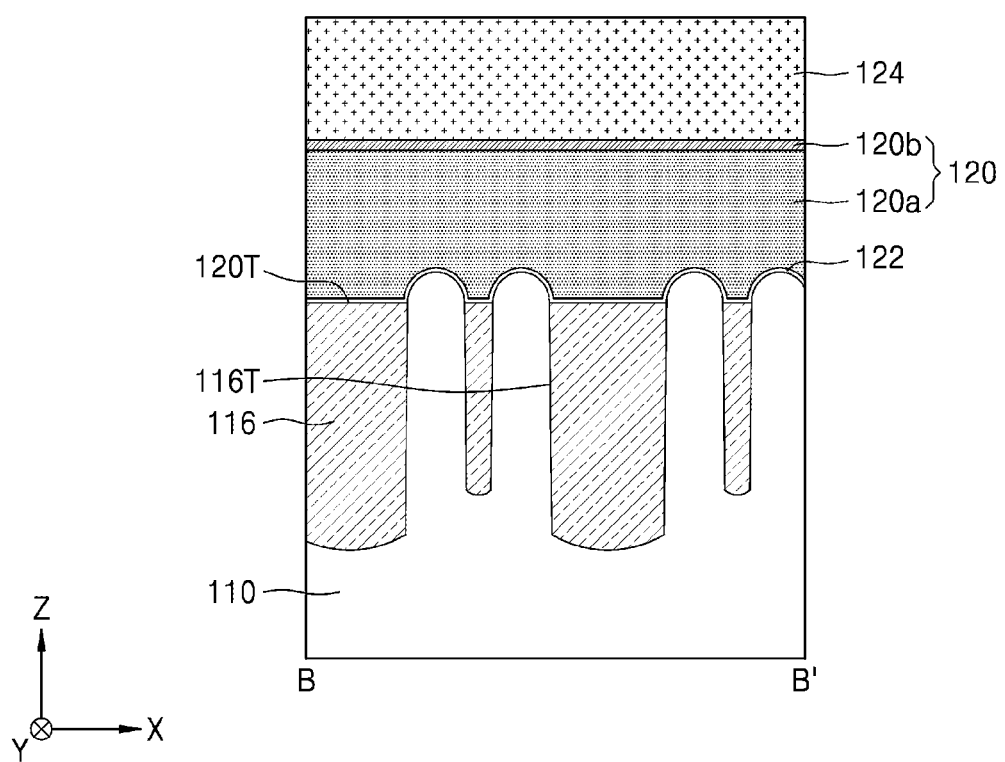
Figure 5C:
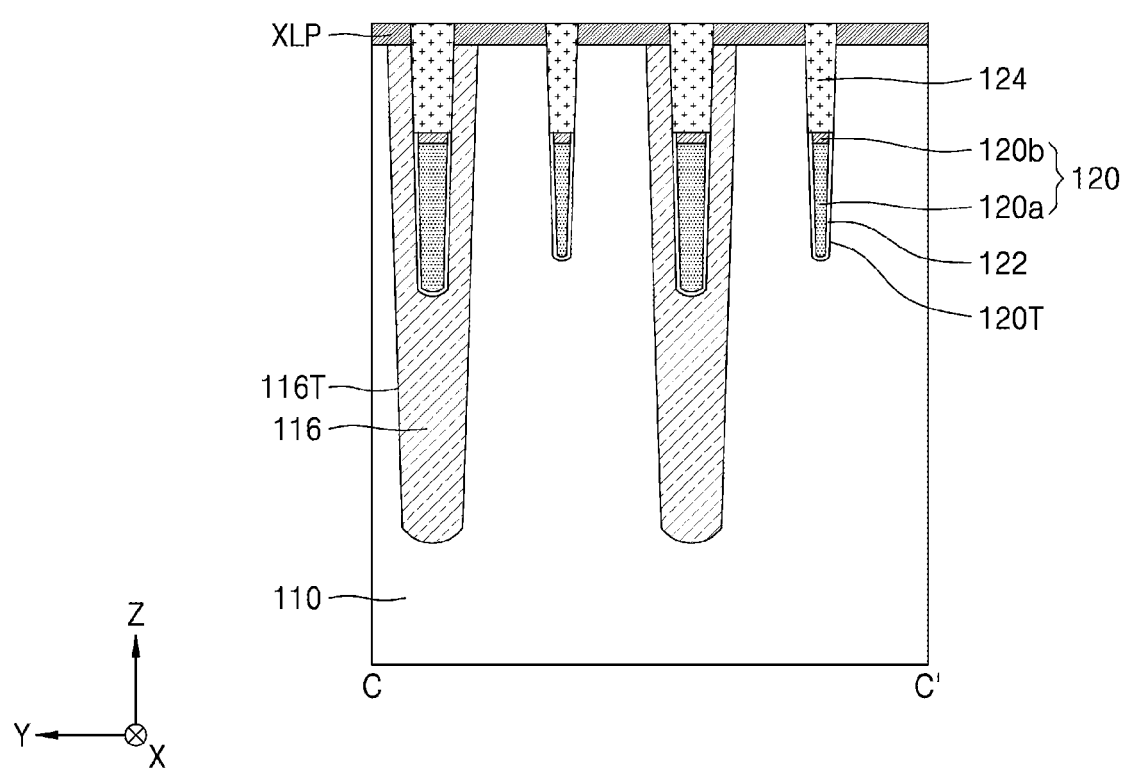
Figure 5D:
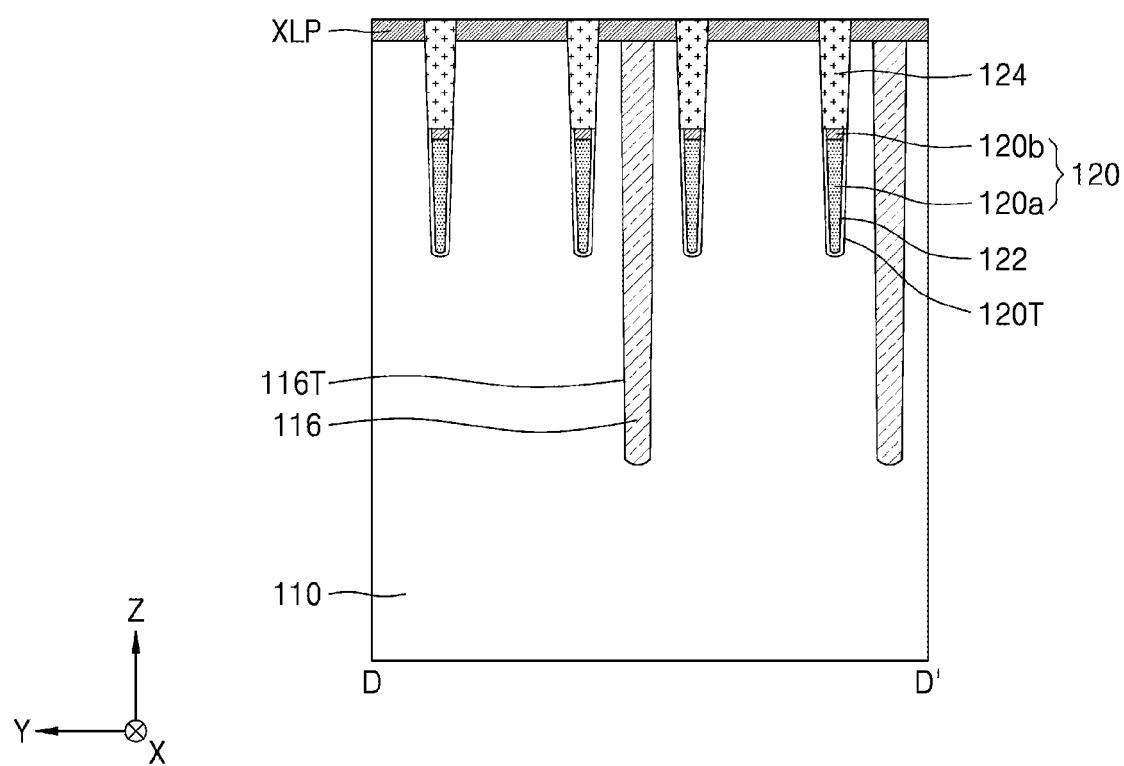

FIG. 4 is a plan layout illustrating a method of manufacturing a semiconductor memory device, according to some embodiments, and FIGS. 5A to 5D are cross-sectional views illustrating a method of manufacturing a semiconductor memory device according to embodiments. In detail, FIGS. 5A, 5B, 5C, and 5D are cross-sectional views taken along lines A-A', B-B', C-C', and D-D' of FIG. 4, respectively.

Referring to FIGS. 4, 5A, 5B, 5C, and 5D together, a portion of a substrate 110 is removed to form a plurality of active regions 118 defined by a device isolation trench 116T.

The plurality of active regions 118 may be formed to have a relatively long island shape having a minor axis and a major axis in a plan view. In some embodiments, the plurality of active regions 118 may be formed to have long axes in a diagonal direction with respect to the first horizontal direction (X direction) and the second horizontal direction (Y direction).

A device isolation layer 116 at least partially filling the device isolation trench 116T is formed. The plurality of active regions 118 may be defined in the substrate 110 by the device isolation layer 116. In some embodiments, the device isolation layer 116 may be formed as a triple layer including a first device isolation layer, a second device isolation layer, and a third device isolation layer, but embodiments are not limited thereto. For example, the first device isolation layer may be formed to conformally at least partially cover an inner surface and a bottom surface of the device isolation trench 116T. In some embodiments, the first device isolation layer may be formed of silicon oxide. For example, the second device isolation layer may be formed to conformally at least partially cover the first device isolation layer. In some embodiments, the second device isolation layer may be made of silicon nitride. For example, the third device isolation layer may be formed to at least partially cover the second device isolation layer and at least partially fill the device isolation trench 116T. In some embodiments, the third device isolation layer may be formed of silicon oxide. For example, the third device isolation layer may be formed of silicon oxide formed of tonen silazene (TOSZ). In some embodiments, the device isolation layer 116 may be formed as a single layer made of one type of insulating layer, a double layer composed of two types of insulating layers, or a multilayer composed of a combination of at least three or more types of insulating layers. For example, the device isolation layer 116 may be formed as a single layer made of silicon oxide.

In some embodiments, a conductive layer (not shown) may be formed on the device isolation layer 116 and the plurality of active regions 118. The conductive layer may at least partially cover the device isolation layer 116 and the plurality of active regions 118. The conductive layer may include Si, Ge, W, WN, Co, Ni, Al, Mo, Ru, Ti, TiN, Ta, TaN, Cu, or a combination thereof. For example, the conductive layer may include polysilicon.

A plurality of word line trenches 120T may be formed in the substrate 110 on which the conductive layer is formed on the device isolation layer 116 and the plurality of active regions 118. The plurality of word line trenches 120T may extend in a first horizontal direction (X-direction) in parallel to each other, and may be formed to have a line shape that crosses the active region 118 and is disposed to be substantially equally spaced in the second horizontal direction (Y direction). In some embodiments, a step may be formed on the bottom surface of the plurality of word line trenches 120T.

After cleaning the product in which the plurality of word line trenches 120T are formed, a plurality of gate dielectric layers 122, a plurality of word lines 120, and a plurality of buried insulating layers 124 may be sequentially formed in the plurality of word line trenches 120T. The plurality of word lines 120 may extend in parallel in a first horizontal direction (X-direction), and may have a line shape that crosses the active region 118 and is disposed to be substantially equally spaced in the second horizontal direction (Y direction). An upper surface of each of the plurality of word lines 120 may be formed to be positioned at a lower vertical level than the upper surface of the substrate 110. The bottom surface of the plurality of word lines 120 may have a concave-convex shape corresponding to the step formed on the bottom surface of the plurality of word line trenches 120T.

A gate dielectric layer 122 may be formed to at least partially cover an inner wall and a bottom surface of the word line trench 120T. In some embodiments, the gate dielectric layer 122 may be formed to extend from between the word line 120 and the word line trench 120T to between the buried insulating layer 124 and the word line trench 120T.

Each of the plurality of word lines 120 may be formed to at least partially fill a lower portion of the plurality of word line trenches 120T. Each of the plurality of word lines 120 may be formed to have a stacked structure of a lower word line layer 120a and an upper word line layer 120b. For example, the lower word line layer 120a may have the gate dielectric layer 122 therebetween and may be formed to conformally at least partially cover an inner wall and a bottom surface of a lower portion of the word line trench 120T. For example, the upper word line layer 120b may at least partially cover the lower word line layer 120a and may be formed to at least partially fill a lower portion of the word line trench 120T.

In some embodiments, before or after forming the plurality of word lines 120, impurity ions may be implanted into portions of the active regions 118 of the substrate 110 on both sides of the plurality of word lines 120 to form source regions and drain regions in the plurality of active regions 118.

The plurality of buried insulating layers 124 may be formed to at least partially fill upper portions of the plurality of word line trenches 120T. The plurality of buried insulating layers 124 may be formed such that upper surfaces of the plurality of buried insulating layers 124 are positioned at substantially the same vertical level as the upper surface of the substrate 110.

The conductive layer may be separated by the plurality of word line trenches 120T to form a plurality of cell pad line patterns XLP. For example, each of the plurality of cell pad line patterns XLP may be formed to have a thickness of about 5 nm to about 20 nm.

In some other embodiments, after forming the plurality of word line trenches 120T in the substrate 110 on which the isolation layer 116 and the plurality of active regions 118 are formed, a plurality of gate dielectric layers 122, a plurality of word lines 120, and a plurality of buried insulating layers 124 may be sequentially formed in the plurality of word line trenches 120T. Thereafter, a conductive layer may be formed on the device isolation layer 116, the plurality of active regions 118, and the plurality of buried insulating layers 124, a mask pattern having a line-shaped opening extending in a first horizontal direction (X direction) may be formed on the conductive layer, and a plurality of cell pad line patterns XLP may be formed by patterning the conductive layer using the mask pattern as an etch mask.

Thereafter, a plurality of cell pad separation patterns may be formed by at least partially filling the space between the plurality of cell pad line patterns XLP, forming an insulating layer (not shown) at least partially covering the plurality of cell pad line patterns XLP, and planarizing an upper portion of the insulating layer until upper surfaces of the plurality of cell pad line patterns XLP are exposed. The plurality of cell pad separation patterns may be upper portions of the plurality of buried insulating layers 124 disposed between the plurality of cell pad line patterns XLP in FIGS. 5C and 5D.

Figure 6:
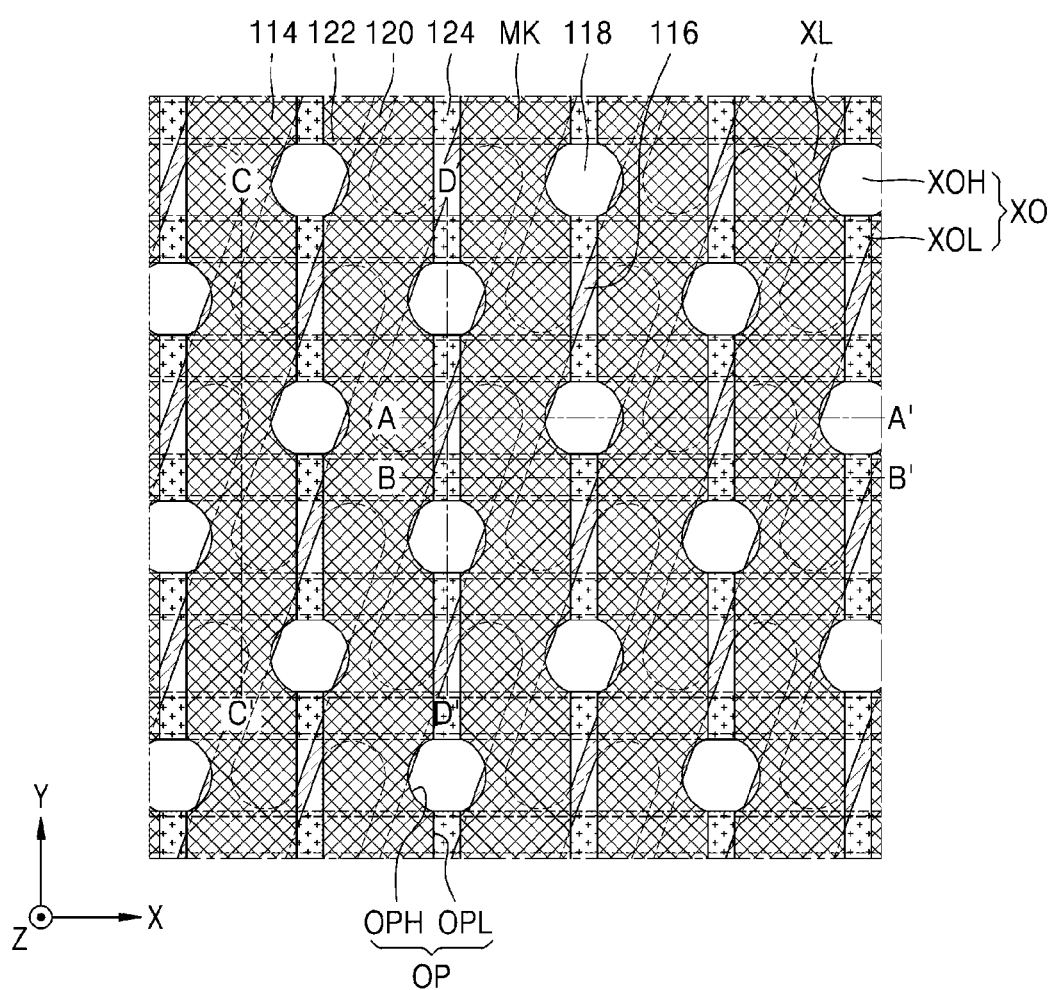
FIG. 6 is a plan layout illustrating a method of manufacturing a semiconductor memory device according to some embodiments.
Figure 7A:
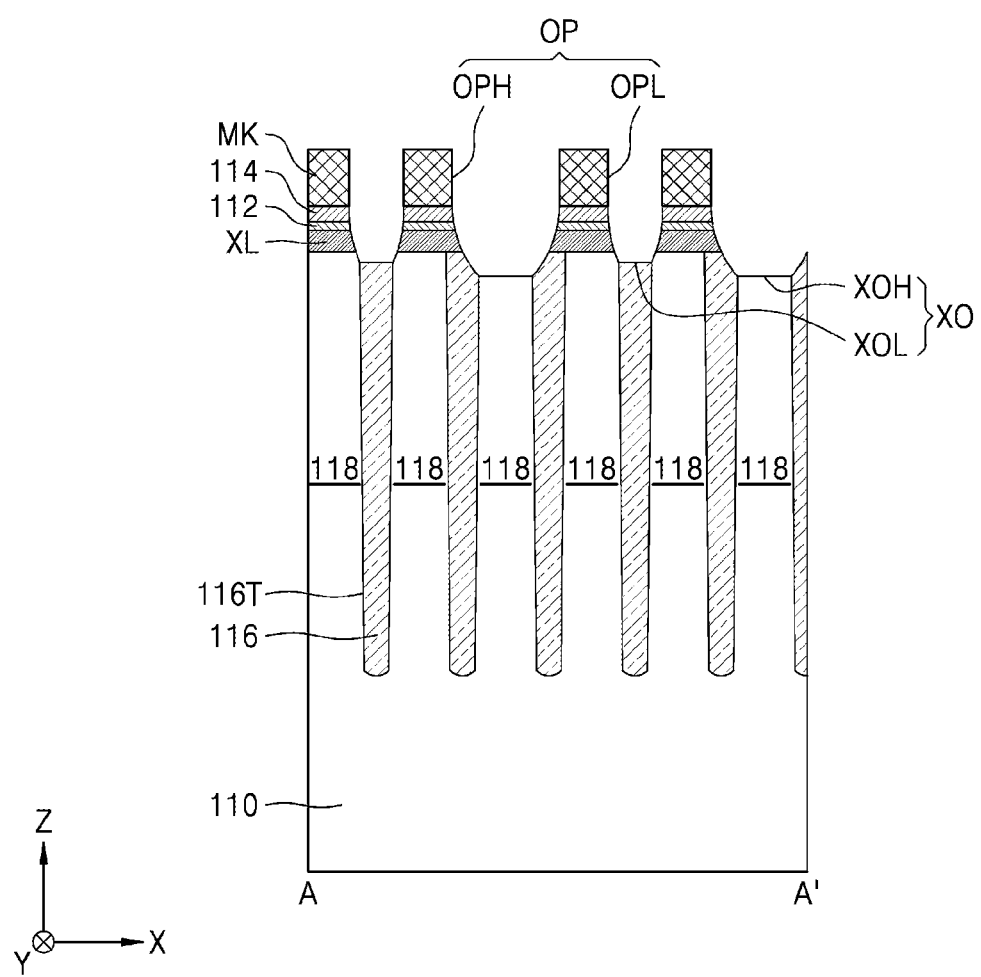
FIGS. 7A to 7D are cross-sectional views illustrating a method of manufacturing a semiconductor memory device according to some embodiments.
Figure 7B:
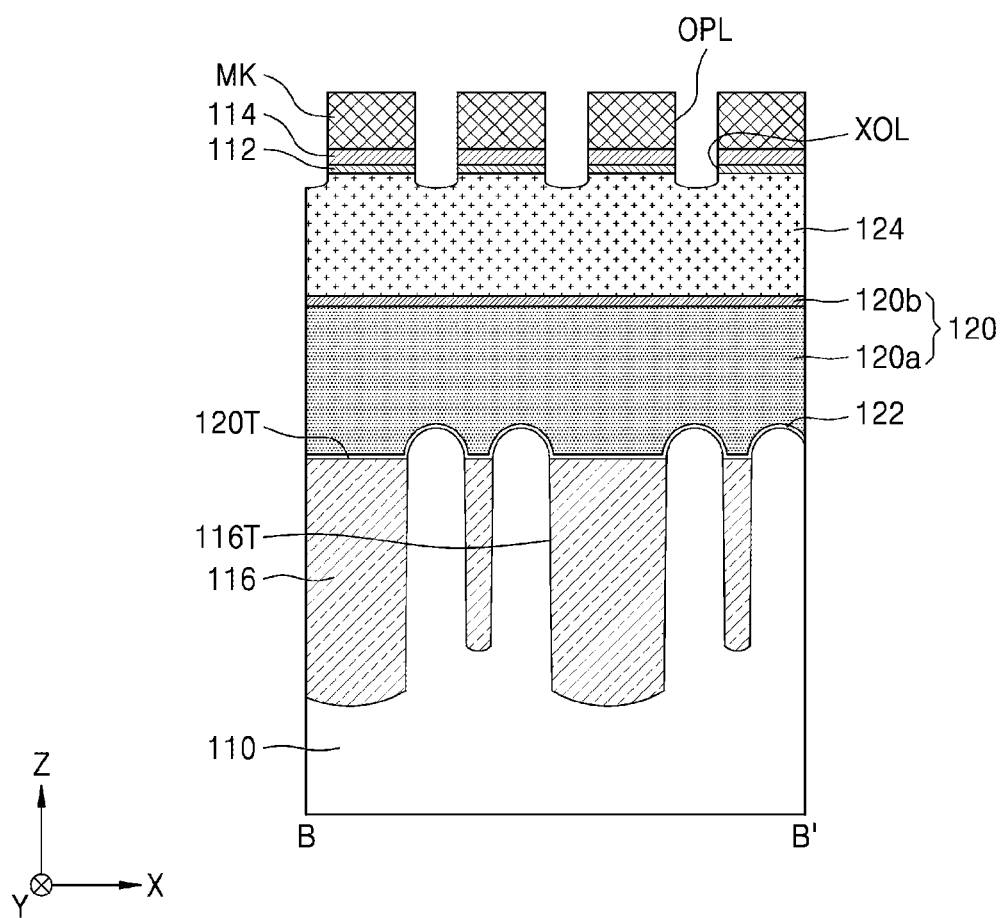
Figure 7C:
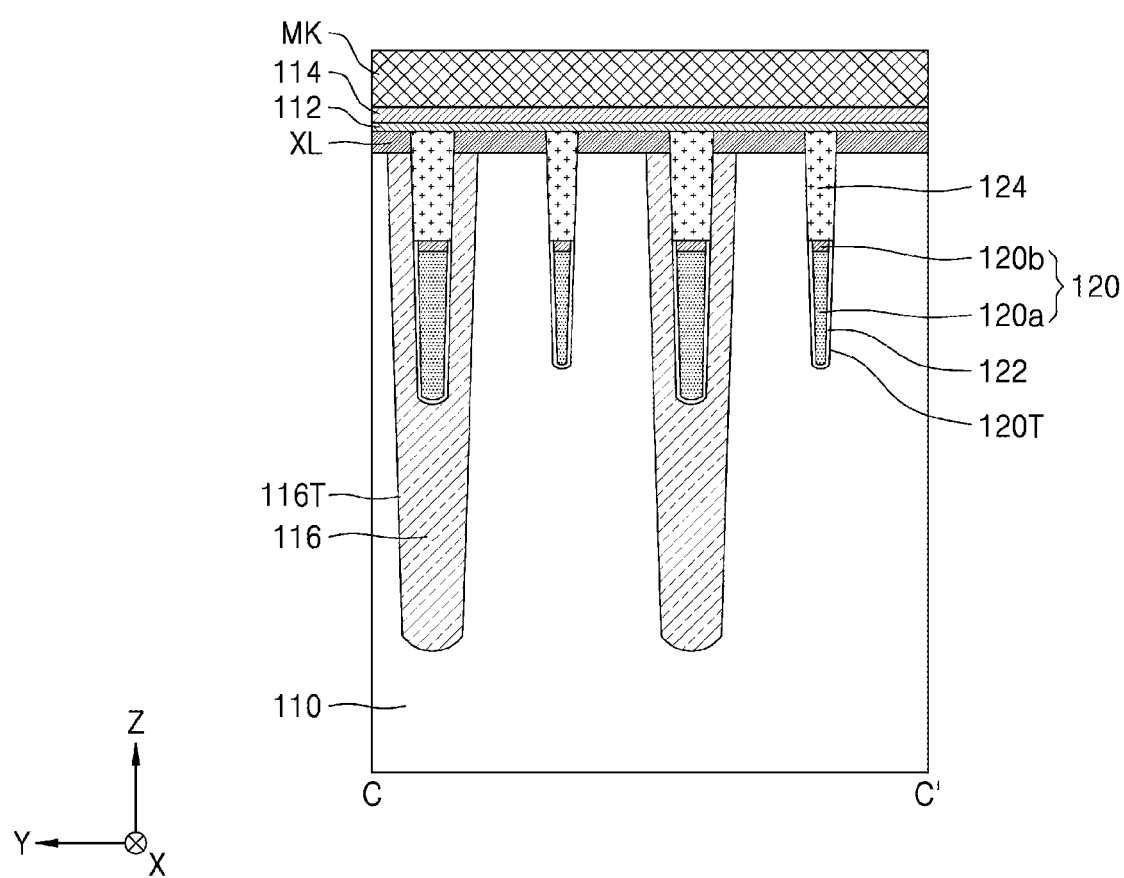
Figure 7D:
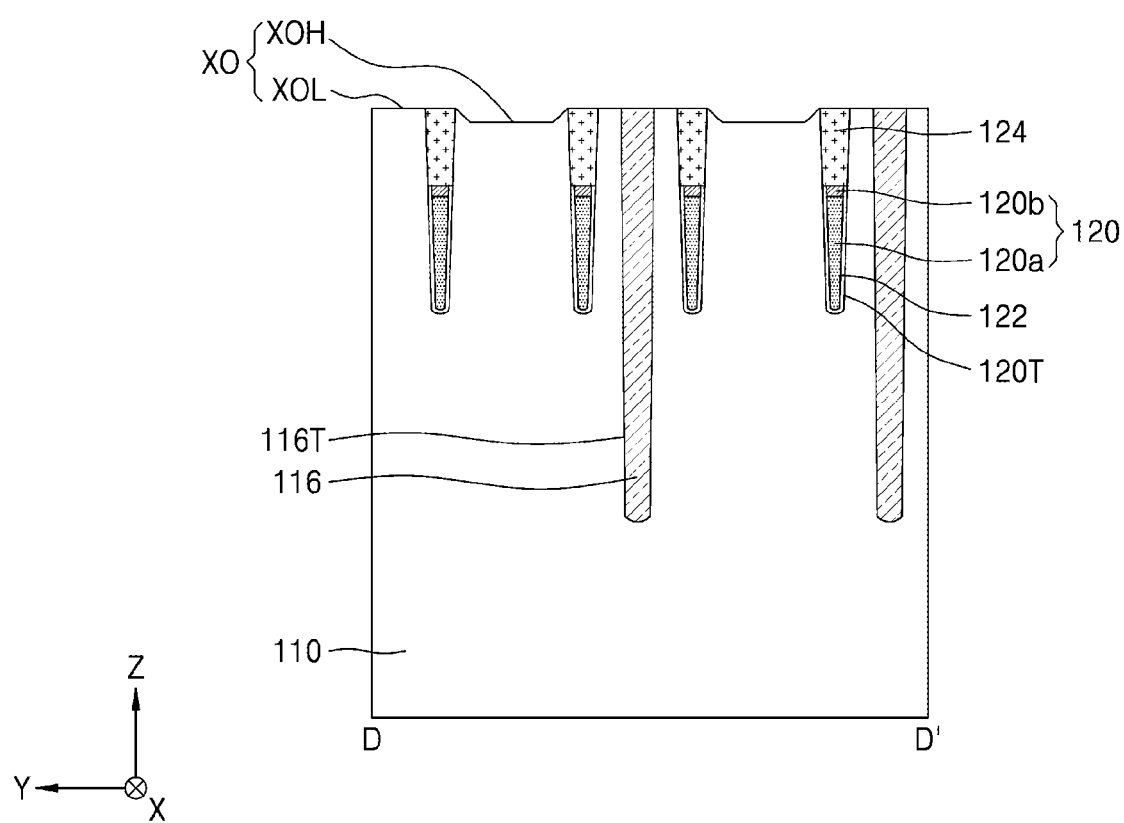

FIG. 6 is a plan layout illustrating a method of manufacturing a semiconductor memory device, according to some embodiments, and FIGS. 7A to 7D are cross-sectional views illustrating a method of manufacturing a semiconductor memory device, according to some embodiments. In detail, FIGS. 7A, 7B, 7C, and 7D are cross-sectional views taken along lines A-A', B-B', C-C', and D-D' of FIG. 7, respectively.

Referring to FIGS. 6, 7A, 7B, 7C, and 7D together, after an insulating layer is formed on the plurality of cell pad line patterns XLP and the plurality of buried insulating layers 124, a mask pattern MK having a plurality of openings OP is formed on the insulating layer. In each of the plurality of openings OP, in a top view, the line opening OPL having a line shape extending in a second horizontal direction (Y direction) and the hole opening OPH having a circular shape may communicate with each other and be alternately disposed in the second horizontal direction (Y direction). For example, the mask pattern MK having the plurality of openings OP may be formed through an EUV lithography process. In some embodiments, the mask pattern MK having the plurality of openings OP may be formed without using a pattern density increasing technique, such as double patterning technology (DPT) or quadruple patterning technology (QPT).

By patterning the insulating layer and the plurality of cell pad line patterns XLP shown in FIGS. 4, 5A, 5C, and 5D using the mask pattern MK as an etch mask, a plurality of cell pad patterns XL and a plurality of insulating layer patterns spaced apart by the plurality of isolation trenches XO may be formed. After the plurality of cell pad patterns XL and the plurality of insulating layer patterns are formed, the mask pattern MK may be removed.

Corresponding to each of the plurality of openings OP, in the plurality of isolation trenches XO, in a top-view, a line trench portion XOL having a line shape extending in a second horizontal direction (Y direction) and a hole trench portion XOH having a circular shape may communicate with each other and be alternately disposed in the second horizontal direction (Y direction). The plurality of isolation trenches XO may extend between the plurality of cell pad patterns XL and the plurality of insulating layer patterns in a second horizontal direction (Y direction).

In some embodiments, each of the plurality of insulating layer patterns may have a stacked structure including a first insulating layer pattern 112 and a second insulating layer pattern 114 on the first insulating layer pattern 112. In some embodiments, the first insulating layer pattern 112 may be made of an oxide, and the second insulating layer pattern 114 may be made of a nitride. For example, the first insulating layer pattern 112 may be made of silicon oxide, and the second insulating layer pattern 114 may be made of silicon nitride or silicon oxynitride. In some other embodiments, the first insulating layer pattern 112 may be formed of a non-metal-based dielectric material, and the second insulating layer pattern 114 may be formed of a metal-based dielectric material. In some embodiments, the second insulating layer pattern 114 may be thicker than the first insulating layer pattern 112.

Hereinafter, each of the plurality of insulating layer patterns will be described as having a stacked structure including the first insulating layer pattern 112 and the second insulating layer pattern 114 on the first insulating layer pattern 112, but embodiments are not limited thereto. For example, each of the plurality of insulating layer patterns may be formed of a single layer, and in this case, the lower surface of the first insulating film pattern 112 and the upper surface of the second insulating film pattern 114 mean the lower surface and the upper surface of the insulating film pattern, respectively.

A device isolation layer 116, a plurality of active regions 118, and a plurality of buried insulating layers 124 may be exposed on a bottom surface of the plurality of isolation trenches XO. On the bottom surface of the hole trench portion XOH, the active region 118 may be exposed relatively more than the device isolation layer 116 and the buried insulating layer 124. A cell pad pattern XL, the first insulating layer pattern 112, and the second insulating layer pattern 114 may be exposed on sidewalls of the plurality of isolation trenches XO.

In the first horizontal direction (X direction), the width of the hole trench portion XOH may be greater than the width of the line trench portion XOL. In some embodiments, the bottom surface of the hole trench portion XOH may be positioned at a lower vertical level than the bottom surface of the line trench portion XOL. That is, the depth of the hole trench portion XOH among the isolation trenches XO may be greater than the depth of the line trench portion XOL. For example, the depth of the hole trench portion XOH may be about 30 nm to about 60 nm.

Figure 8:
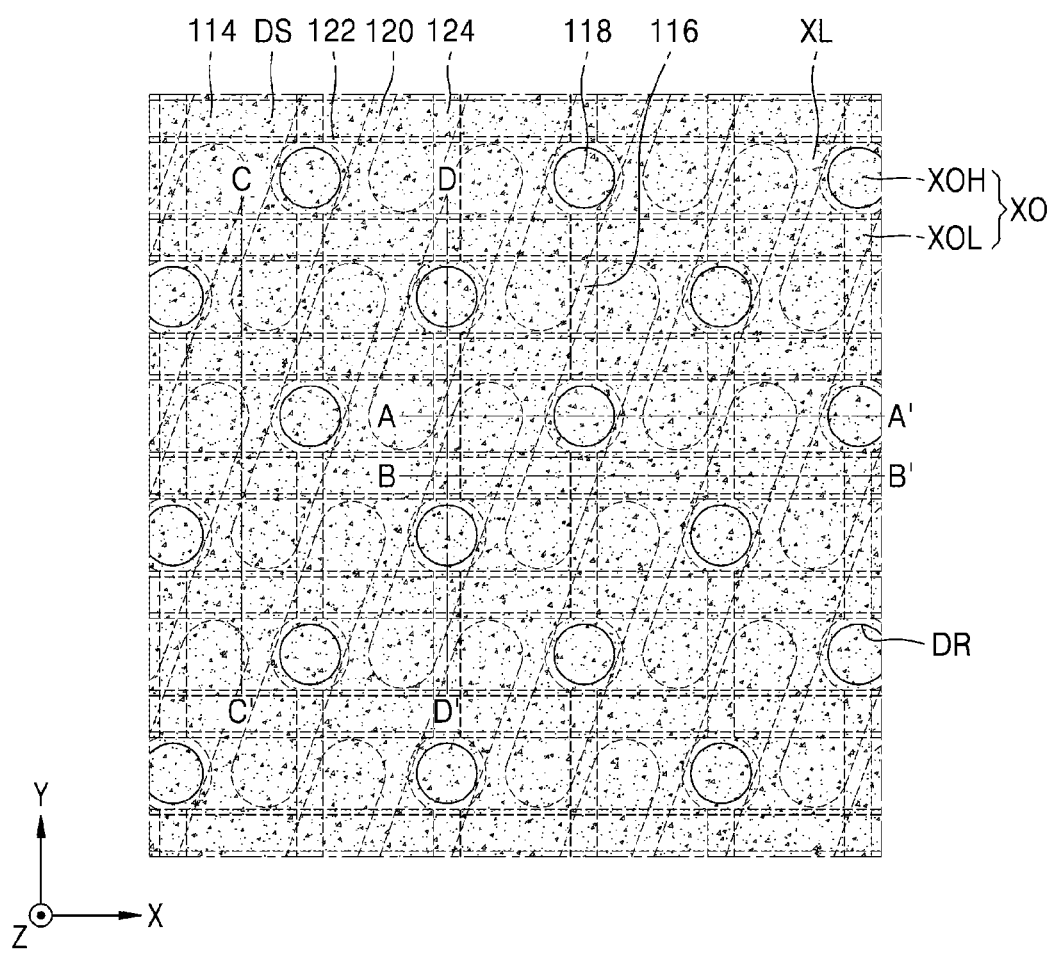
FIG. 8 is a plan layout illustrating a method of manufacturing a semiconductor memory device according to some embodiments.
Figure 9A:
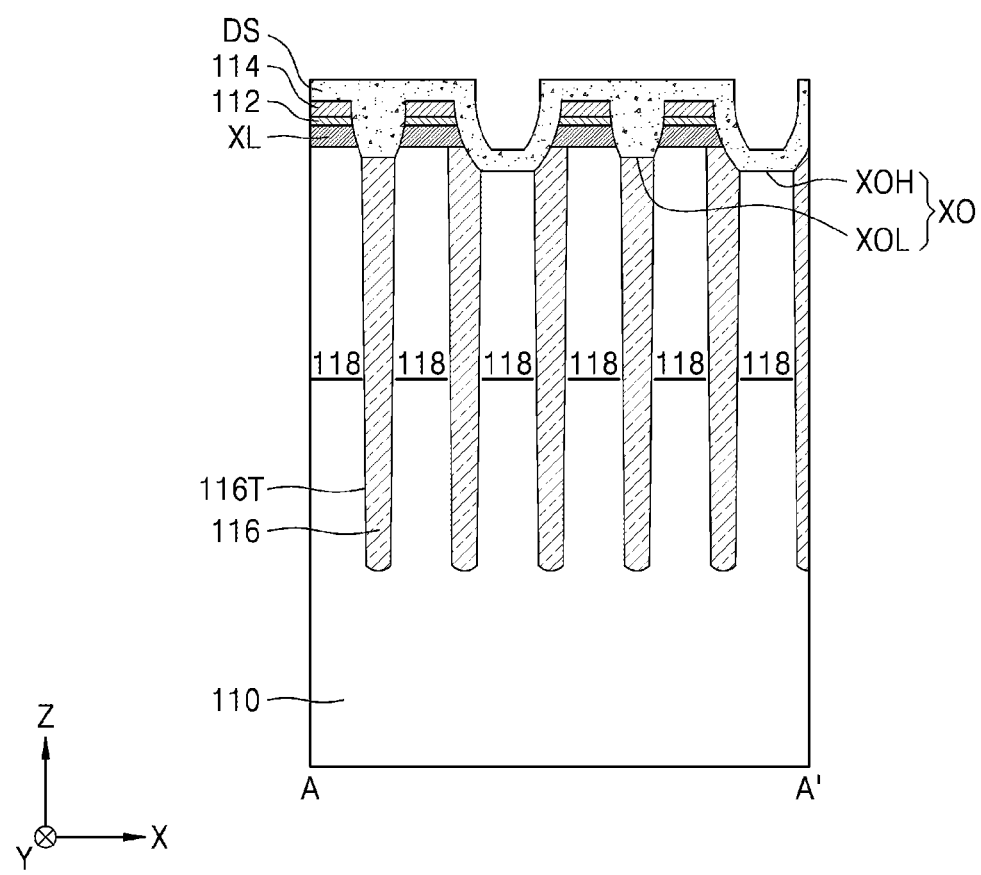
FIGS. 9A to 9D are cross-sectional views illustrating a method of manufacturing a semiconductor memory device according to some embodiments.
Figure 9B:
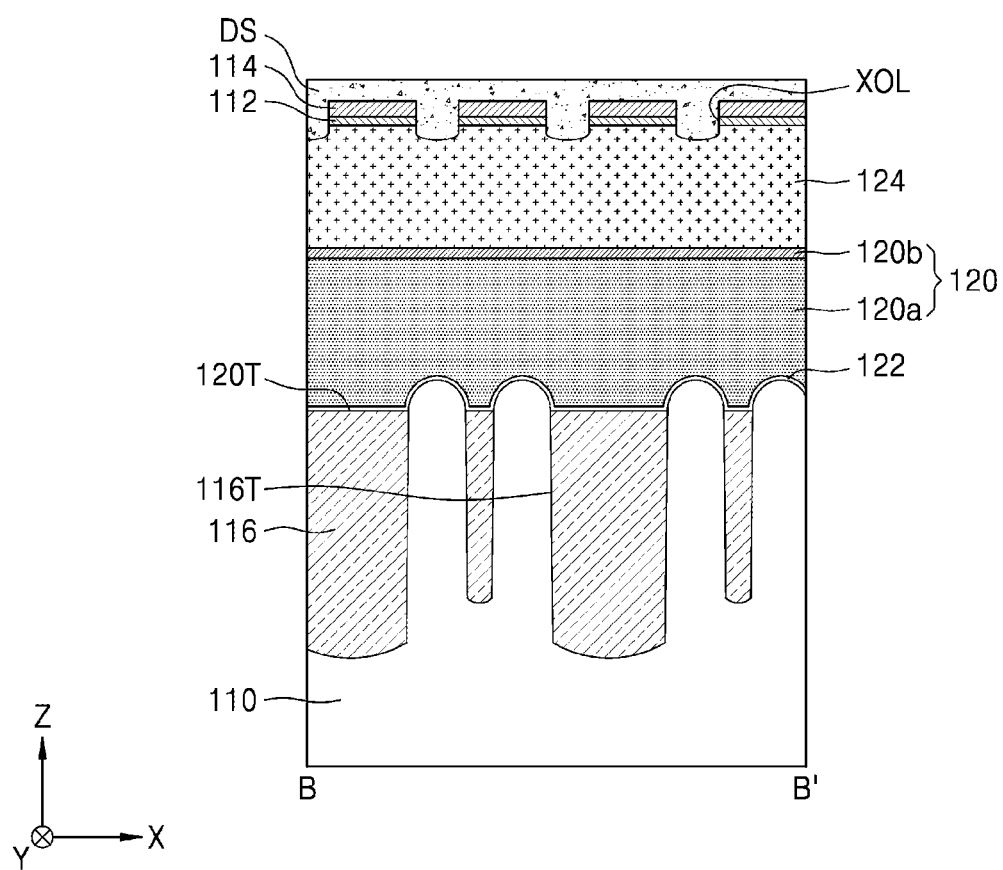
Figure 9C:
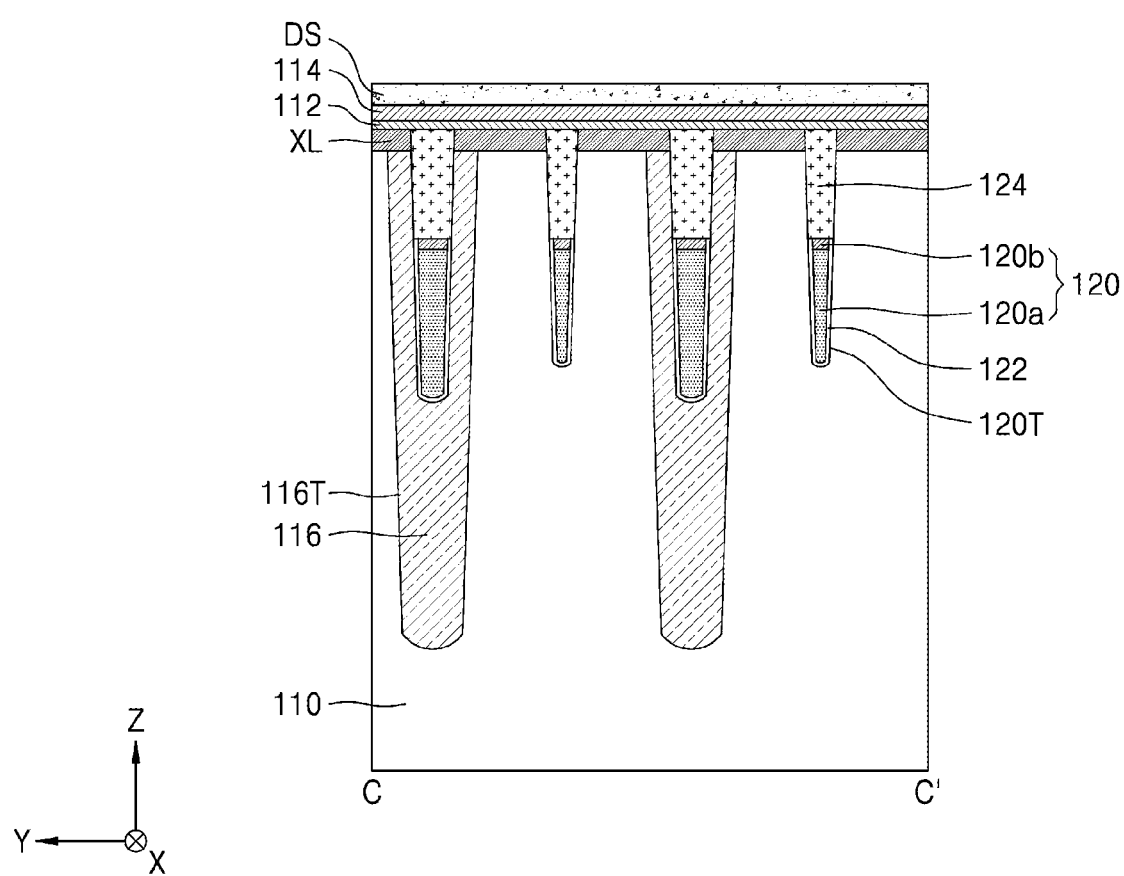
Figure 9D:
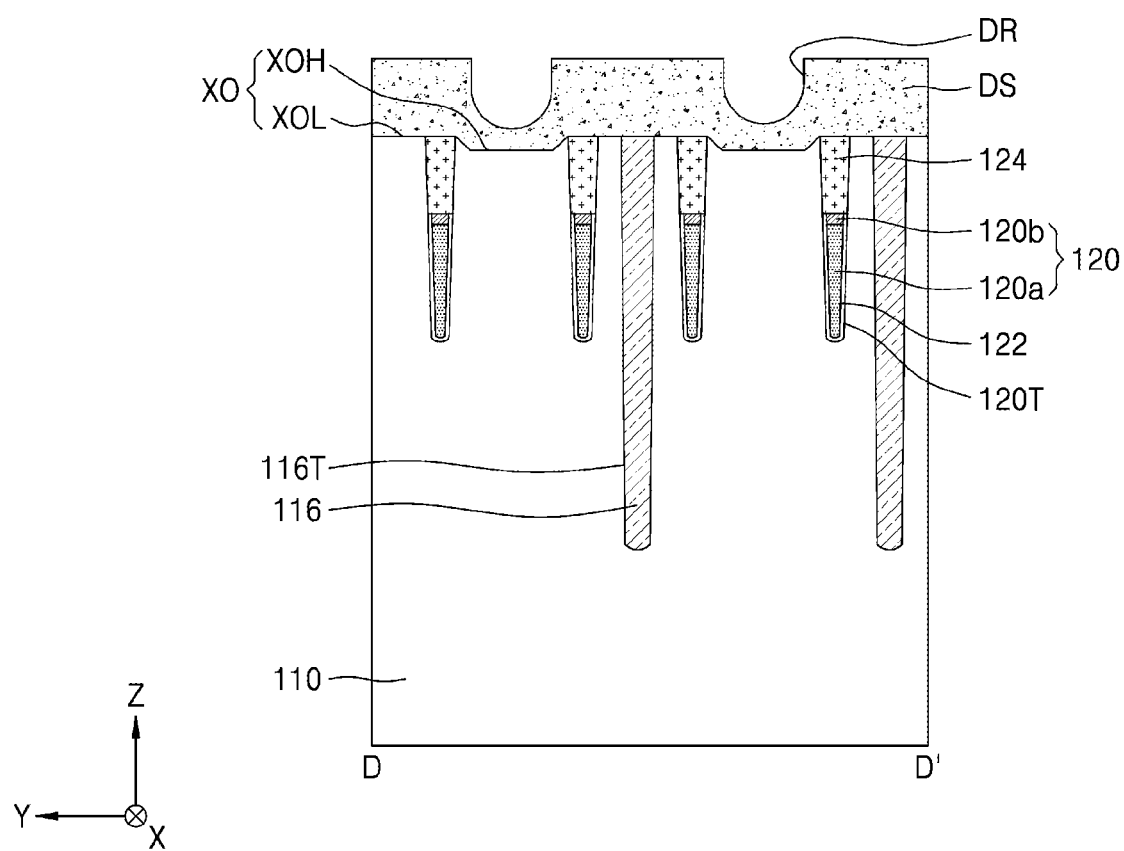

FIG. 8 is a plan layout illustrating a method of manufacturing a semiconductor memory device, according to some embodiments, and FIGS. 9A to 9D are cross-sectional views illustrating a method of manufacturing a semiconductor memory device according to some embodiments. In detail, FIGS. 9A, 9B, 9C, and 9D are cross-sectional views taken along lines A-A', B-B', C-C', and D-D' of FIG. 8, respectively.

Referring to FIGS. 8, 9A, 9B, 9C, and 9D together, an isolation insulating material layer DS is formed on the resultant structure of FIGS. 6, 7A, 7B, 7C, and 7D. The isolation insulating material layer DS may at least partially cover an upper surface of the second insulating layer pattern 114 and sidewalls and a bottom surface of the isolation trench XO. For example, the isolation insulating material layer DS may at least partially cover upper and side surfaces of the second insulating layer pattern 114, side surfaces of the first insulating layer pattern 112, an upper surface of the device isolation layer 116, upper surfaces of the plurality of active regions 118, and upper surfaces of the plurality of buried insulating layers 124. In some embodiments, the isolation insulating material layer DS may be formed to conformally at least partially cover the upper surface of the second insulating layer pattern 114 and sidewalls and bottom surfaces in the isolation trench XO.

For example, the insulating material layer DS may be formed of an oxide, a nitride, and/or a metal-based dielectric material. In some embodiments, the isolation insulating material layer DS may have substantially the same etching characteristics as the second insulating layer pattern 114 in the etching process of forming an isolation insulating pattern DSP, which is described with reference to FIGS. 10, 11A, 11B, 11C, and 11D.

The isolation insulating material layer DS may be formed to have a thickness equal to or greater than ½ of the width of the line trench portion XOL and less than ½ of the width of the hole trench portion XOH in the first horizontal direction (X direction). For example, when the width of the line trench portion XOL is about 10 nm and the width of the hole trench portion XOH is about 30 nm in the first horizontal direction (X direction), the isolation insulating material layer DS may be formed to have a thickness of about 5 nm to about 10 nm. The isolation insulating material layer DS may be formed to completely fill the line trench portion XOL, but only partially fill the hole trench portion XOH. In some embodiments, the isolation insulating material layer DS may fill the line trench portion XOL to a greater degree than the hold trench portion XOH. The isolation insulating material layer DS may at least partially cover sidewalls and a bottom surface of the hole trench portion XOH, and may define the recess portion DR in the hole trench portion XOH.

FIG. 10 is a plan layout illustrating a method of manufacturing a semiconductor memory device, according to some embodiments, and FIGS. 11A to 11D are cross-sectional views illustrating a method of manufacturing a semiconductor memory device according to some embodiments. In detail, FIGS. 11A, 11B, 11C, and 11D are cross-sectional views taken along lines A-A', B-B', C-C', and D-D' of FIG. 10, respectively.

Referring to FIGS. 10, 11A, 11B, 11C, and 11D together, a portion of the isolation insulating material layer DS shown in FIGS. 8, 9A, 9B, 9C, and 9D is removed to expose the second insulating layer pattern 114 and the plurality of active regions 118 to form the isolation insulating pattern DSP. The isolation insulating pattern DSP may be formed by removing a portion of the isolation insulating material layer DS, at least partially covering the upper surface of the second insulating layer pattern 114 that is an outside portion of the isolation trench XO and a portion that covers the active region 118 at the bottom of the hole trench portion XOH, that is, a portion of the isolation insulating material layer DS positioned on the lower surface of the recess portion DR.

The isolation insulating pattern DSP may include the isolation insulating line portion DSL at least partially filling the line trench portion XOL and the isolation insulating spacer portion DSS at least partially covering the sidewall of the hole trench portion XOH. In the isolation insulating pattern DSP, in a plan view, the isolation insulating line portion DSL having a line shape extending in the second horizontal direction (Y direction) and the isolation insulating spacer portion DSS having a ring shape may be connected to each other in the second horizontal direction (Y direction) and be alternately disposed. In the first horizontal direction (X direction), the width of the isolation insulating spacer portion DSS may be greater than the width of the isolation insulating line portion DSL. Because the isolation insulating line portion DSL and the isolation insulating spacer portion DSS are structures formed by removing a portion of the isolation insulating material layer DS shown in FIGS. 8, 9A, 9B, 9C, and 9D, they are connected to each other and form an integral or monolithic body.

In some embodiments, the upper surface of the isolation insulating pattern DSP may be located at the same vertical level as the upper surface of the second insulating layer pattern 114 to be coplanar.

The isolation insulating line portion DSL may be interposed between the cell pad patterns XL adjacent in the first horizontal direction (X direction) to separate them to be insulated from each other. The isolation insulating spacer portion DSS may at least partially cover the cell pad pattern XL, the first insulating layer pattern 112, and the second insulating layer pattern 114 exposed on sidewalls of the plurality of isolation trenches XO. The isolation insulating spacer portion DSS may at least partially surround a conductive layer 130 for direct contact to be seen in FIGS. 12 and 13A and separate the conductive layer 130 for direct contact to be insulated from the adjacent cell pad pattern XL.

Figure 12:
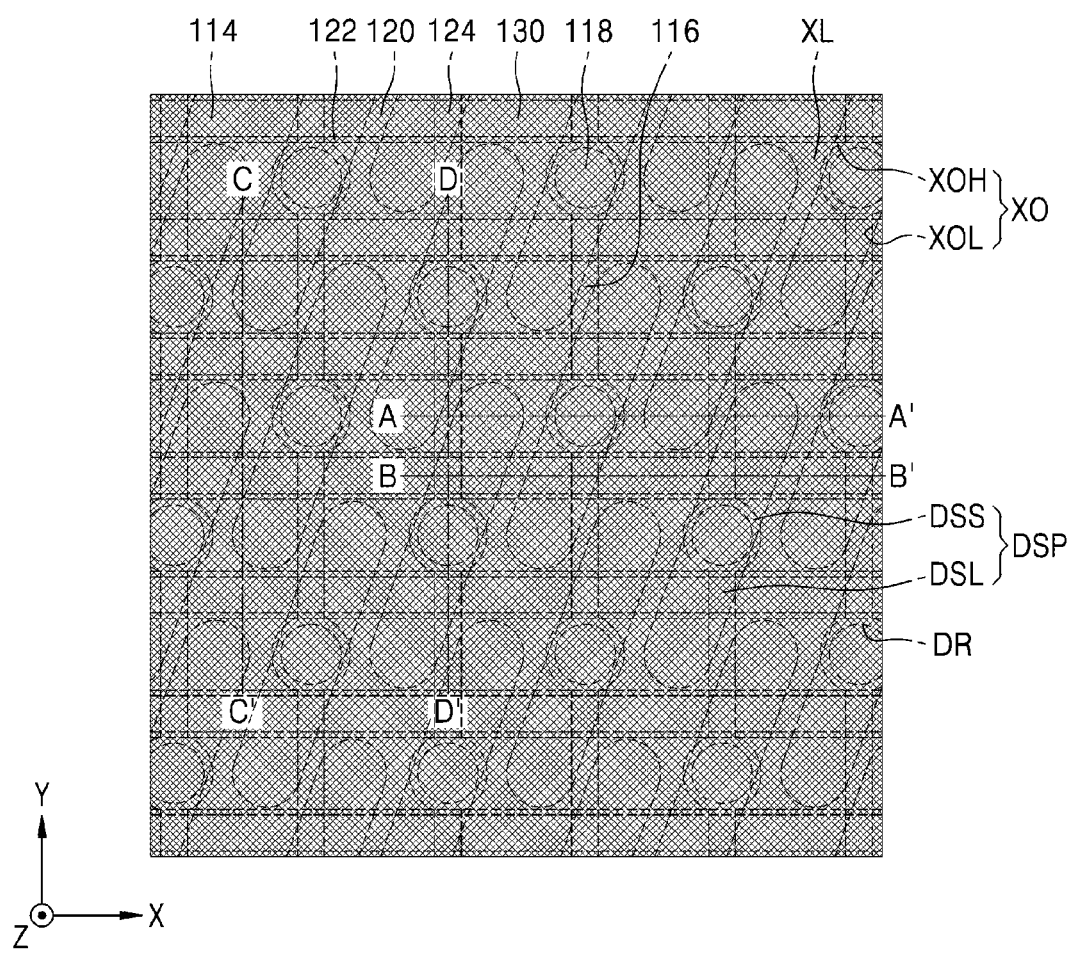
FIG. 12 is a plan layout illustrating a method of manufacturing a semiconductor memory device according to some embodiments.
Figure 13A:
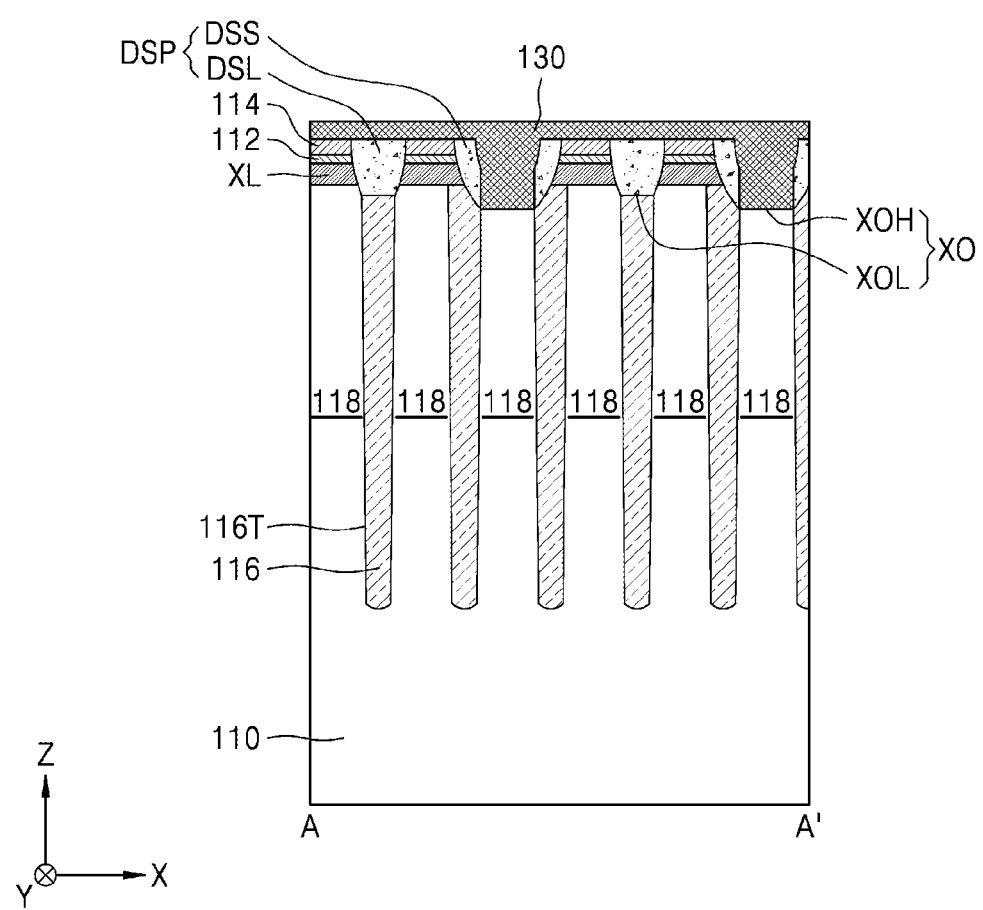
FIGS. 13A to 13D are cross-sectional views illustrating a method of manufacturing a semiconductor memory device according to some embodiments.
Figure 13B:
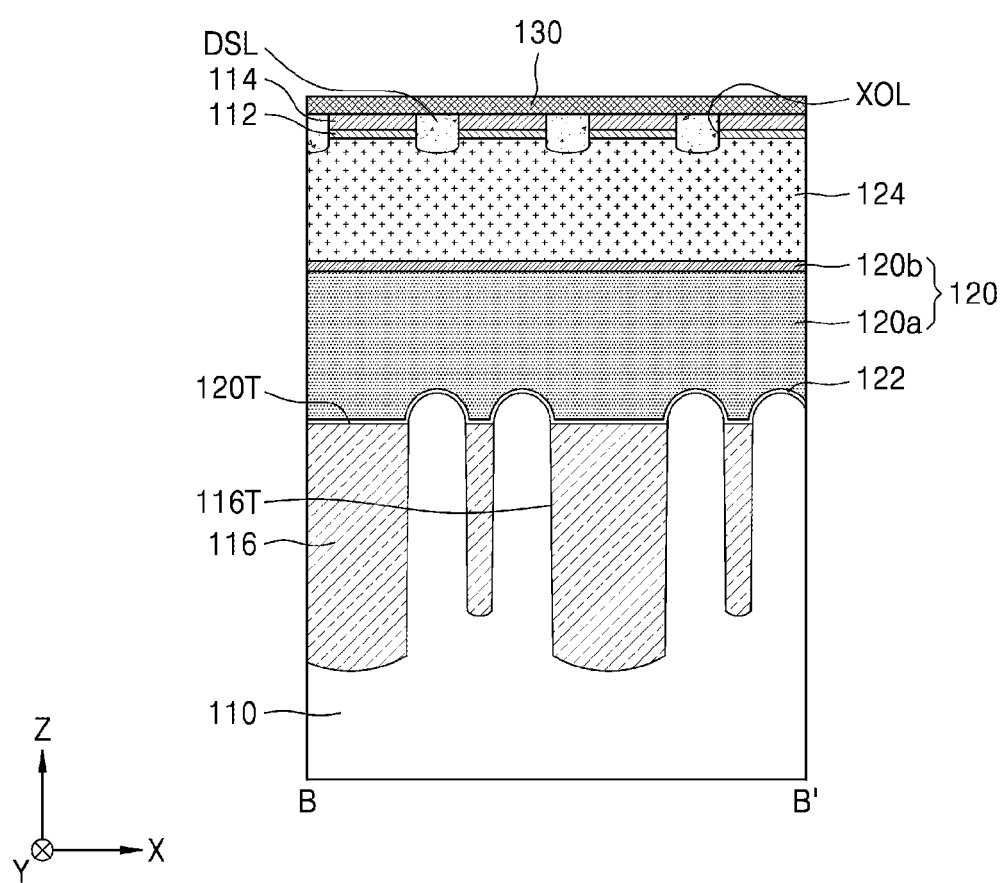
Figure 13C:
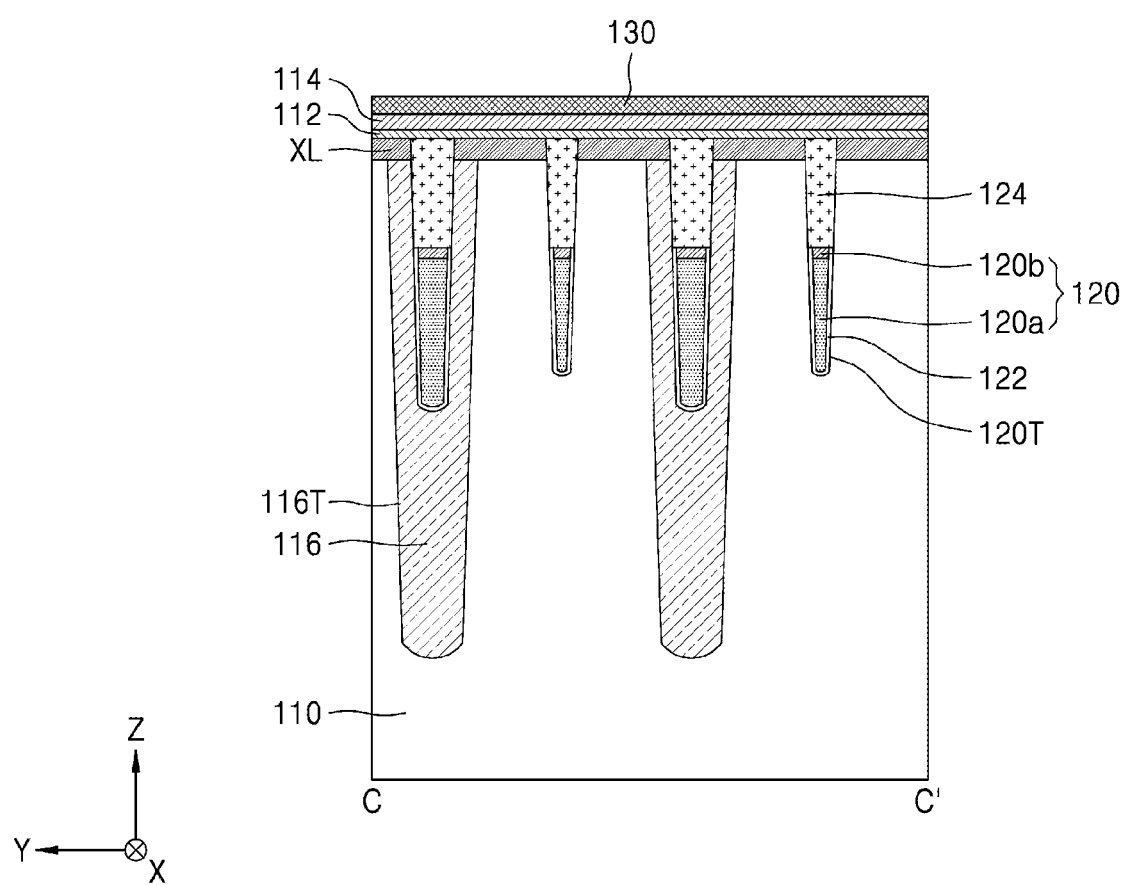
Figure 13D:
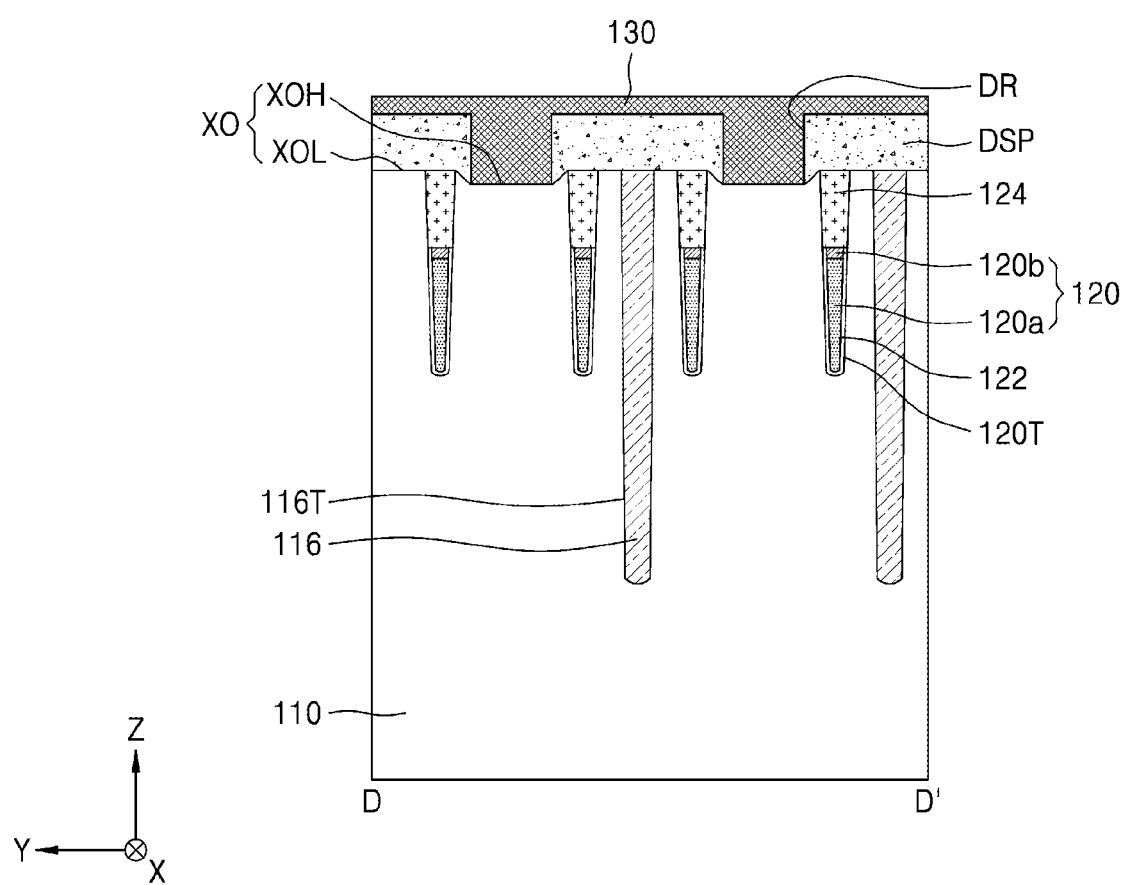
Figure 14A:
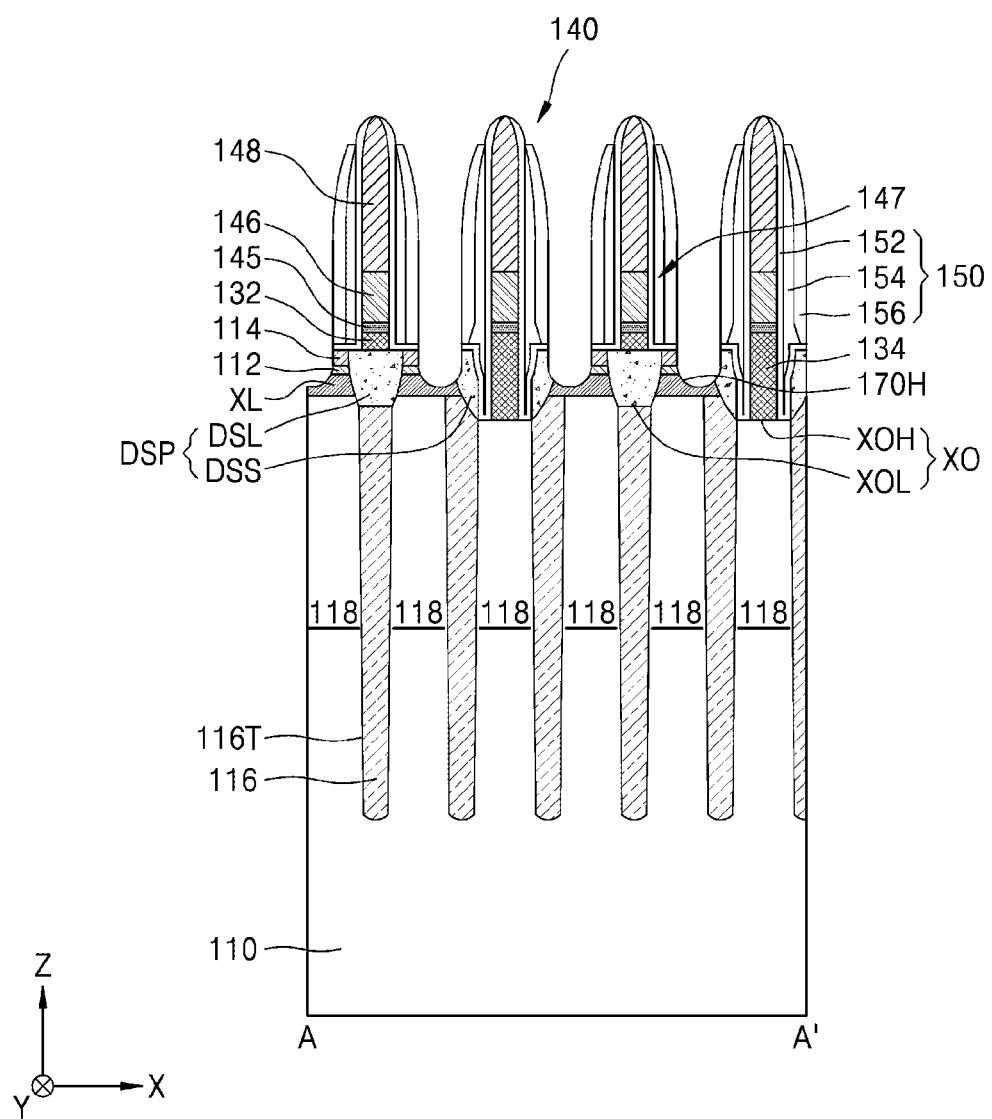
FIGS. 14A to 14D are cross-sectional views illustrating a method of manufacturing a semiconductor memory device according to some embodiments.
Figure 14B:
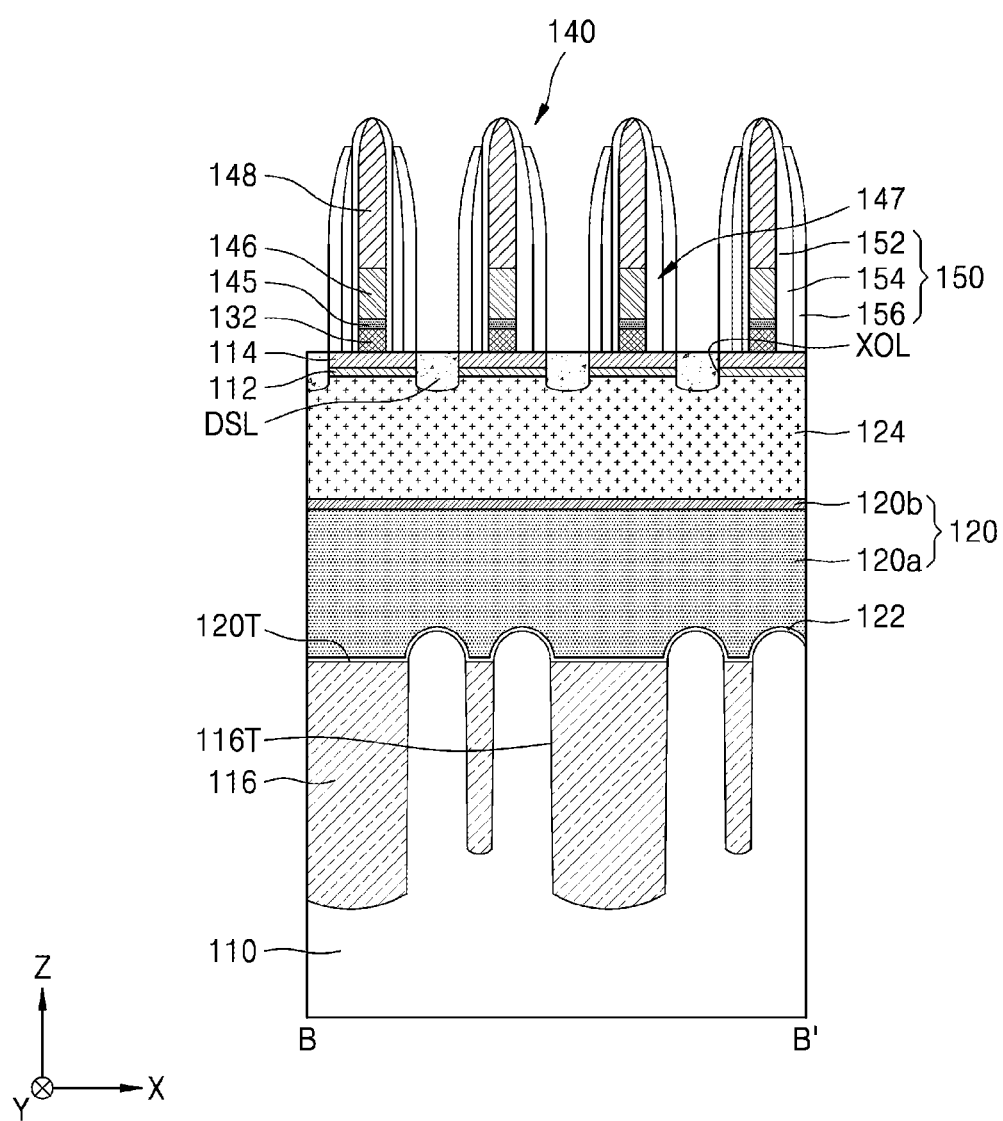
Figure 14C:
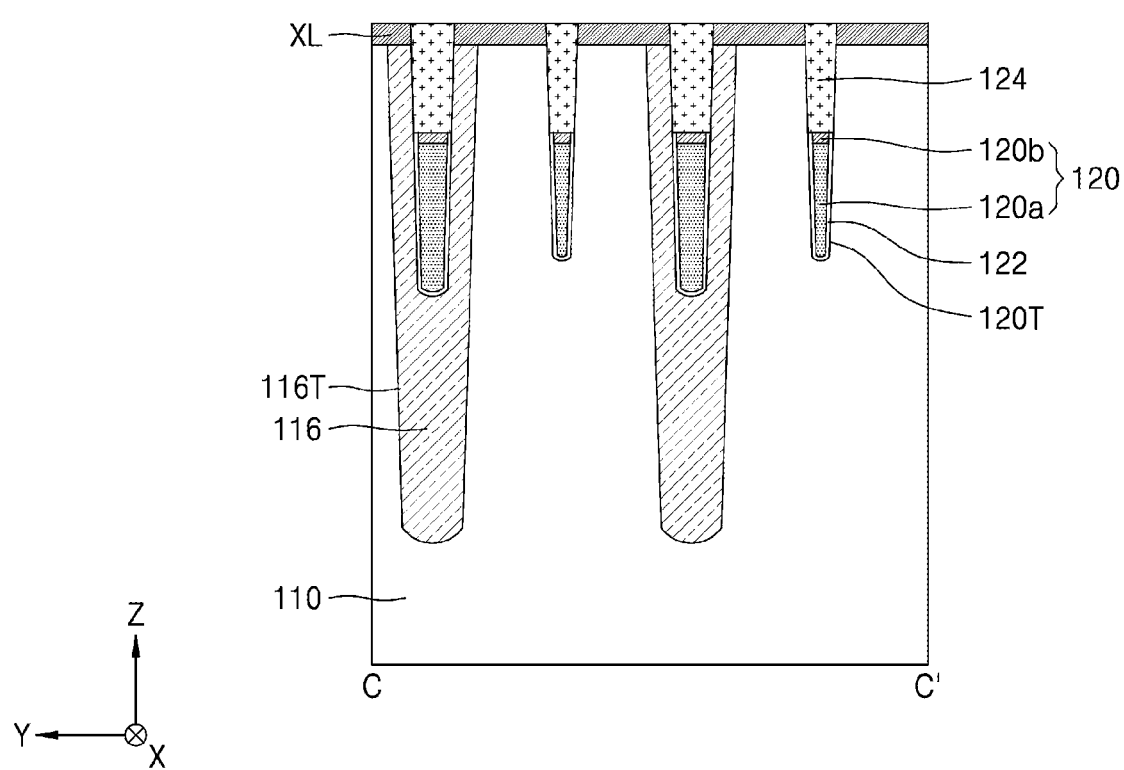
Figure 14D:
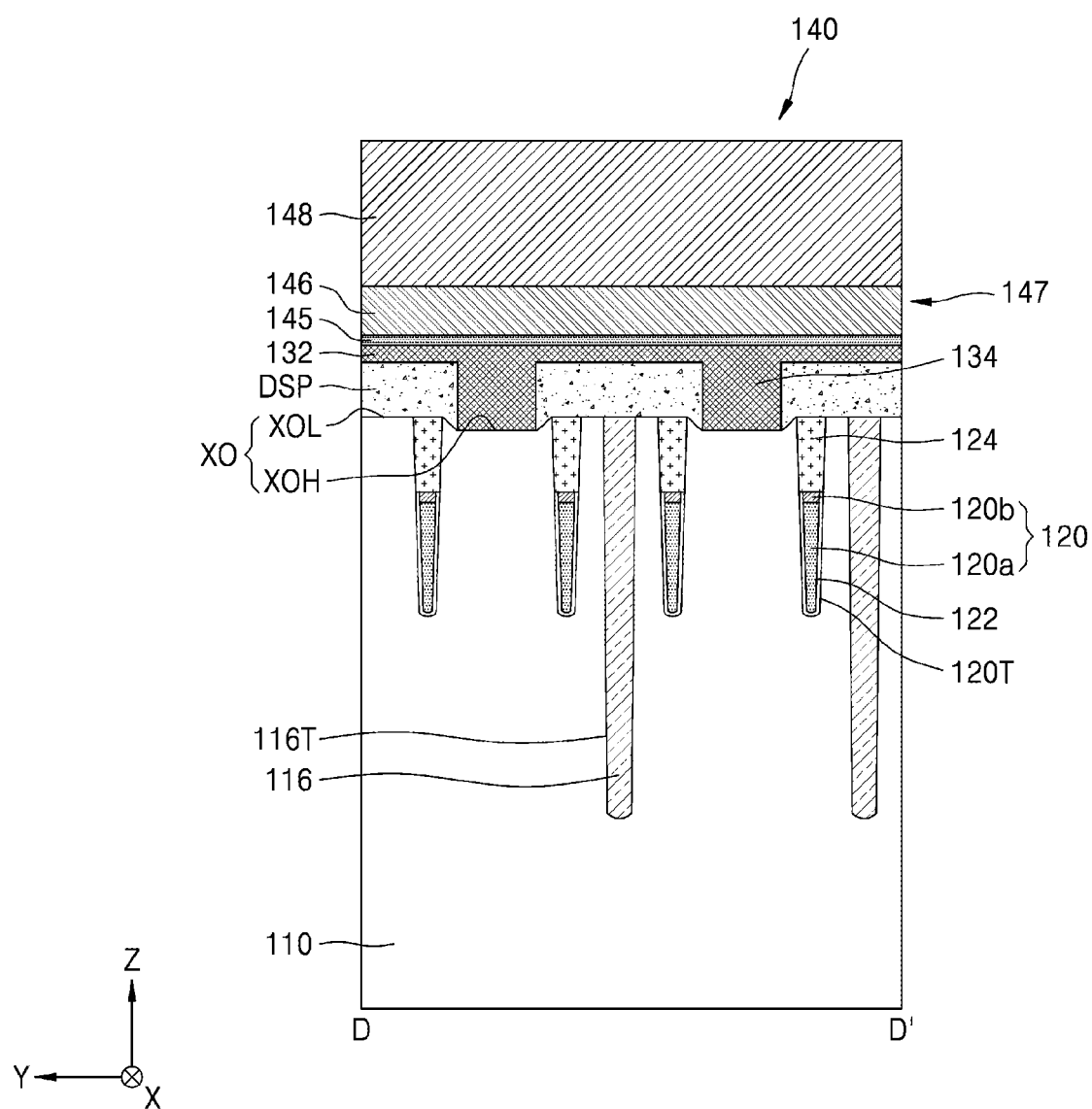

FIG. 12 is a plan layout illustrating a method of manufacturing a semiconductor memory device, according to some embodiments, and FIGS. 13A to 13D are cross-sectional views illustrating a method of manufacturing a semiconductor memory device according to embodiments. In detail, FIGS. 13A, 13B, 13C, and 13D are cross-sectional views taken along lines A-A', B-B', C-C', and D-D' of FIG. 12, respectively.

Referring to FIGS. 12, 13A, 13B, 13C, and 13D together, a conductive layer 130 for direct contact is formed on the isolation insulating pattern DSP and the second insulating layer pattern 114. The conductive layer 130 for direct contact may be formed to at least partially fill the hole trench portion XOH and at least partially cover the upper surface of the isolation insulating pattern DSP and the upper surface of the second insulating layer pattern 114. The conductive layer 130 for direct contact may be made of, for example, doped polysilicon. In some embodiments, the conductive layer 130 for direct contact may include an epitaxial silicon layer.

A sidewall of the hole trench portion XOH may be at least partially covered by the isolation insulating spacer portion DSS of the isolation insulating pattern DSP. That is, a separation insulating spacer portion DSS may be interposed between the cell pad pattern XL exposed on the sidewall of the hole trench portion XOH and the conductive layer 130 for direct contact. The isolation insulating spacer portion DSS may at least partially surround the conductive layer 130 for direct contact and separate the conductive layer 130 for direct contact to be insulated from the cell pad pattern XL exposed on the sidewall of the hole trench portion XOH.

FIGS. 14A to 14D are cross-sectional views illustrating a method of manufacturing a semiconductor memory device according to some embodiments. In detail, FIGS. 14A, 14B, 14C, and 14D are cross-sectional views taken along lines A-A', B-B', C-C', and D-D' of FIG. 2, respectively.

Referring to FIGS. 14A to 14D together, a metal-based conductive layer for forming a bit line structure 140 and an insulating capping layer are sequentially formed on a conductive layer 130 for direct contact. In some embodiments, the metal-based conductive layer may have a stacked structure of a first metal-based conductive layer and a second metal-based conductive layer. By etching the first metal-based conductive layer, the second metal-based conductive layer, and the insulating capping layer, a plurality of bit lines 147 and a plurality of insulating capping lines 148 having a stacked structure of a line-shaped first metal-based conductive pattern 145 and a second metal-based conductive pattern 146 are formed.

One bit line 147 and one insulating capping line 148 at least partially covering one bit line 147 may constitute one bit line structure 140. A plurality of bit line structures 140 each including a bit line 147 and an insulating capping line 148 at least partially covering the bit line 147 may extend in a second horizontal direction (Y direction) parallel to the main surface of the substrate 110 in parallel to each other. The plurality of bit lines 147 may constitute the plurality of bit lines BL illustrated in FIG. 2. In some embodiments, the bit line structure 140 may further include a conductive semiconductor pattern 132 that is a portion of the conductive layer 130 for direct contact disposed between the second insulating layer pattern 114 and the first metal-based conductive pattern 145.

In the etching process for forming the plurality of bit lines 147, a plurality of conductive semiconductor patterns 132 and a plurality of direct contact conductive patterns 134 may be formed by removing a portion of the conductive layer 130 for direct contact that does not vertically overlap the bit line 147 together through the etching process. In this case, the second insulating layer pattern 114 and the isolation insulating material layer DS may function as an etch stop layer in an etching process of forming the plurality of bit lines 147, the plurality of conductive semiconductor patterns 132, and the plurality of direct contact conductive patterns 134. The plurality of bit lines 147 may be formed to be electrically connected to the plurality of active regions 118 through the plurality of direct contact conductive patterns 134.

An insulating spacer structure 150 at least partially covering both sidewalls of each of the plurality of bit line structures 140 may be formed. The plurality of insulating spacer structures 150 may be formed to include a first insulating spacer 152, a second insulating spacer 154, and a third insulating spacer 156, respectively. In some embodiments, after a material having an etch selectivity with respect to the first insulating spacer 152 and the third insulating spacer 156 is formed between the first insulating spacer 152 and the third insulating spacer 156, the second insulating spacer 154 may be an air spacer formed by removing a corresponding material in a subsequent process. In some embodiments, the insulating spacer structure 150 may include the second insulating spacer 154 made of oxide and the third insulating spacer 156 made of nitride.

A plurality of insulating fences 180 are formed in a space between the plurality of insulating spacer structures 150 at least partially covering both sidewalls of each of the plurality of bit line structures 140. The plurality of insulating fences 180 may be spaced apart from each other and arranged in a line between the pair of insulating spacer structures 150 facing each other among the plurality of insulating spacer structures 150 at least partially covering both sidewalls of the plurality of bit line structures 140, that is, along the second horizontal direction (Y direction). For example, the plurality of insulating fences 180 may be made of nitride.

In some embodiments, the plurality of insulating fences 180 may be formed to penetrate or extend through the second insulating layer pattern 114 and the first insulating layer pattern 112 to extend into the buried insulating layer 124, but embodiments are not limited thereto. In some other embodiments, the plurality of insulating fences 180 may penetrate or extend into the second insulating layer pattern 114 and the first insulating layer pattern 112 but not extend into the buried insulating layer 124, may extend into the second insulating layer pattern 114 but not penetrate or extend into the first insulating layer pattern 112, may penetrate the second insulating layer pattern 114 and extend into the first insulating layer pattern 112 but not pass through the first insulating layer pattern 112, or may not extend into the second insulating layer pattern 114. In other embodiments, the plurality of insulating fences 180 may not extend into the second insulating layer pattern 114, and lower surfaces of the plurality of insulating fences 180 may be in contact with the upper surface of the second insulating layer pattern 114.

Between each of the plurality of bit lines 147, a plurality of contact holes 170H may be defined between the plurality of insulating fences 180. The plurality of contact holes 170H and the plurality of insulating fences 180 may be alternately disposed, between a pair of insulating spacer structures 150 facing each other among the plurality of insulating spacer structures 150 at least partially covering both sidewalls of the plurality of bit line structures 140, that is, along the second horizontal direction (Y direction). An inner space of the plurality of contact holes 170H may be defined by an insulating spacer structure 150 at least partially covering sidewalls of each of the two adjacent bit lines 147, an insulating fence 180, and a cell pad pattern XL between two adjacent bit lines 147 among the plurality of bit lines 147. In some embodiments, each of the plurality of contact holes 170H may extend from between the insulating spacer structure 150 and the insulating fence 180 into the cell pad pattern XL on the active region 118. For example, each of the plurality of contact holes 170H may extend from between the insulating spacer structure 150 and the insulating fence 180 into the cell pad pattern XL on the active region 118, but may not pass through the cell pad pattern XL.

The plurality of contact holes 170H may be formed by removing portions of the second insulating layer pattern 114, the first insulating layer pattern 112, and the cell pad pattern XL using the plurality of insulating capping lines 148, the insulating spacer structure 150 at least partially covering both sidewalls of each of the plurality of bit line structures 140, and the plurality of insulating fences 180 as an etch mask. In some embodiments, the plurality of contact holes 170H may be formed to expand a space defined by the cell pad pattern XL by first performing an anisotropic etching process, and then performing an isotropic etching process of further removing another portion of the cell pad pattern XL, wherein the anisotropic etching process refers to removing portions of the second insulating layer pattern 114, the first insulating layer pattern 112, and the cell pad pattern XL using the plurality of insulating capping lines 148, the insulating spacer structure 150 at least partially covering both sidewalls of each of the plurality of bit line structures 140, and the plurality of insulating fences 180 as an etch mask.

In some embodiments, the plurality of contact holes 170H may be arranged in a line in each of the first horizontal direction (X direction) and the second horizontal direction (Y direction). Each of the plurality of contact holes 170H may extend in a vertical direction (Z direction) perpendicular to the substrate 110 from the active region 118.

In the process of forming the plurality of insulating fences 180 and the plurality of contact holes 170H, by removing the insulating capping line 148 included in the bit line structure 140 and the upper portion of the insulating spacer structure 150, the level of the upper surface of the bit line structure 140 may be lowered.

After at least partially filling the plurality of contact holes 170H and forming a landing pad material layer at least partially covering the plurality of bit line structures 140, a portion of the landing pad material layer may be removed to form the recess portion 190R. A plurality of landing pads 190 separated into a plurality by the recess portion 190R may be formed. The plurality of landing pads 190 may at least partially fill the plurality of contact holes 170H and extend onto the plurality of bit line structures 140. In some embodiments, before forming the landing pad material layer, a metal silicide layer may be formed on the plurality of cell pad patterns XL.

The plurality of landing pads 190 may be spaced apart from each other with the recess 190R therebetween. The plurality of landing pads 190 may at least partially fill the plurality of contact holes 170H to be in contact with the plurality of cell pad patterns XL and extend onto the plurality of bit line structures 140. In some embodiments, the plurality of landing pads 190 may be connected to the active region 118 through the cell pad pattern XL. In some other embodiments, the plurality of landing pads 190 may be connected to the cell pad pattern XL and the active region 118. In some embodiments, the plurality of landing pads 190 may extend onto the plurality of bit lines 147.

The recess portion 190R may be at least partially filled by the insulating structure 195. In some embodiments, the insulating structure 195 may include an interlayer insulating layer and an etch stop layer. For example, the interlayer insulating layer may be formed of an oxide, and the etch stop layer may be formed of a nitride. In FIGS. 3A and 3C, the upper surface of the insulating structure 195 is illustrated as being positioned at the same vertical level as the upper surface of the plurality of landing pads 190, but embodiments are not limited thereto. For example, the insulating structure 195 may have an upper surface positioned at a vertical level higher than the upper surface of the plurality of landing pads 190 by at least partially filling the recess portion 190R and at least partially covering the upper surfaces of the plurality of landing pads 190.

A plurality of lower electrodes 210 are formed on the plurality of landing pads 190. In some embodiments, the plurality of lower electrodes 210 may be formed by performing a deposition process at a temperature of about 450° C. to about 700° C. Each of the plurality of lower electrodes 210 may be electrically connected to each of the plurality of landing pads 190. In FIGS. 3A and 3C, the upper surface of the insulating structure 195 is illustrated as being positioned at the same level as the lower surface of the lower electrode 210, but embodiments are not limited thereto.

Each of the plurality of lower electrodes 210 may be formed to have a columnar shape, that is, a pillar shape, filled therein to have a circular horizontal cross-section, but embodiments are not limited thereto. In some embodiments, each of the plurality of lower electrodes 210 may be formed to have a cylindrical shape with a closed lower portion. In some embodiments, the plurality of lower electrodes 210 may be arranged in a honeycomb shape arranged in a zigzag pattern with respect to the first horizontal direction (X direction) or the second horizontal direction (Y direction). In some other embodiments, the plurality of lower electrodes 210 may be arranged in a matrix form arranged in a line in each of the first horizontal direction (X direction) and the second horizontal direction (Y direction). Although not shown separately, at least one support pattern in contact with the sidewalls of the plurality of lower electrodes 210 may be further formed.

A capacitor dielectric layer 220 at least partially covering the plurality of lower electrodes 210 is formed. The capacitor dielectric layer 220 may be formed to conformally at least partially cover the surfaces of the plurality of lower electrodes 210. In some embodiments, the capacitor dielectric layer 220 may be integrally formed to at least partially cover the surfaces of the plurality of lower electrodes 210 together in a predetermined area, for example, within one cell block (SCB of FIG. 1). The capacitor dielectric layer 220 may be formed by performing a deposition process at a temperature of about 400° C. or less. In some embodiments, to form the capacitor dielectric layer 220, an annealing process may be performed at a temperature of about 200° C. to about 700° C.

Thereafter, by forming the upper electrode 230 at least partially covering the capacitor dielectric layer 220, the plurality of capacitor structures 200 including the plurality of lower electrodes 210, the capacitor dielectric layer 220, and the upper electrode 230 may be formed.

Figure 15A:
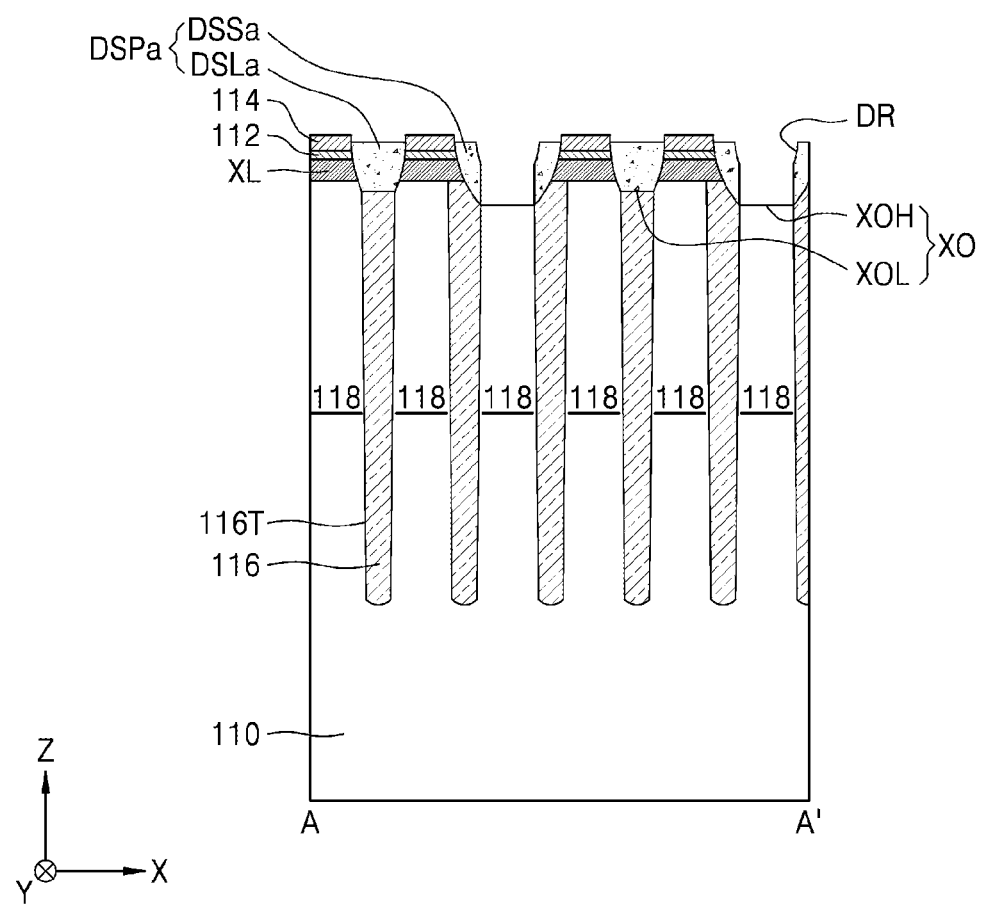
FIGS. 15A and 15B are cross-sectional views illustrating a method of manufacturing a semiconductor memory device according to some embodiments.
Figure 15B:
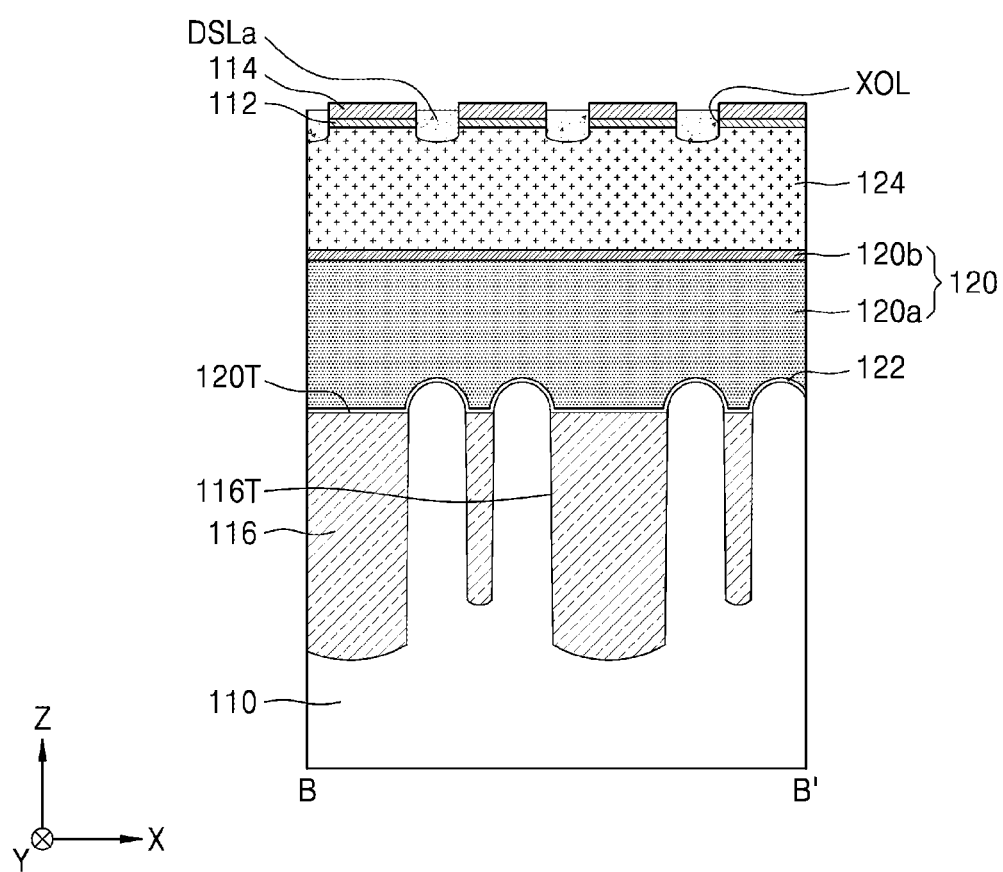
Figure 16A:
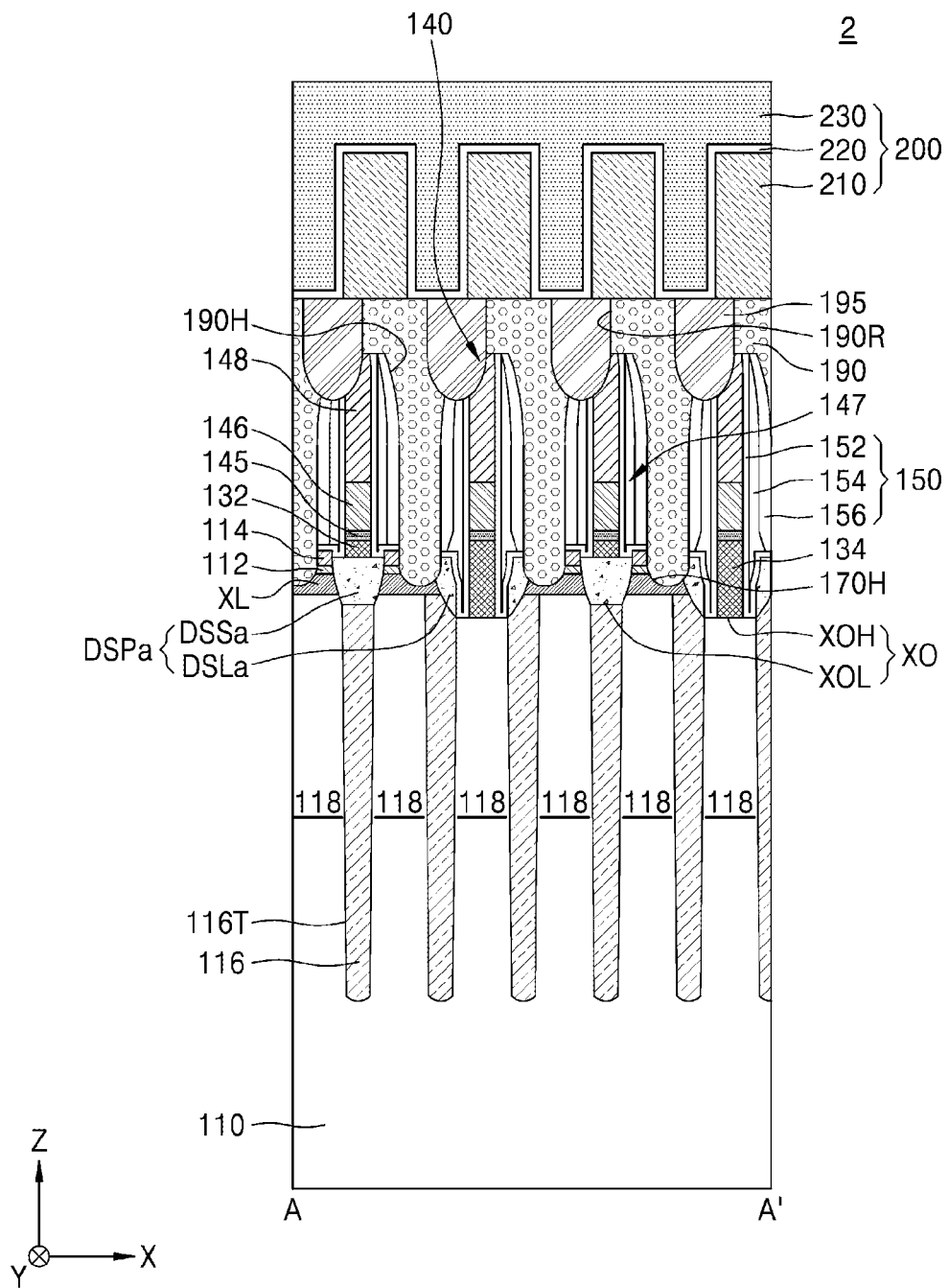
FIGS. 16A and 16B are cross-sectional views illustrating semiconductor memory devices according to some embodiments.
Figure 16B:
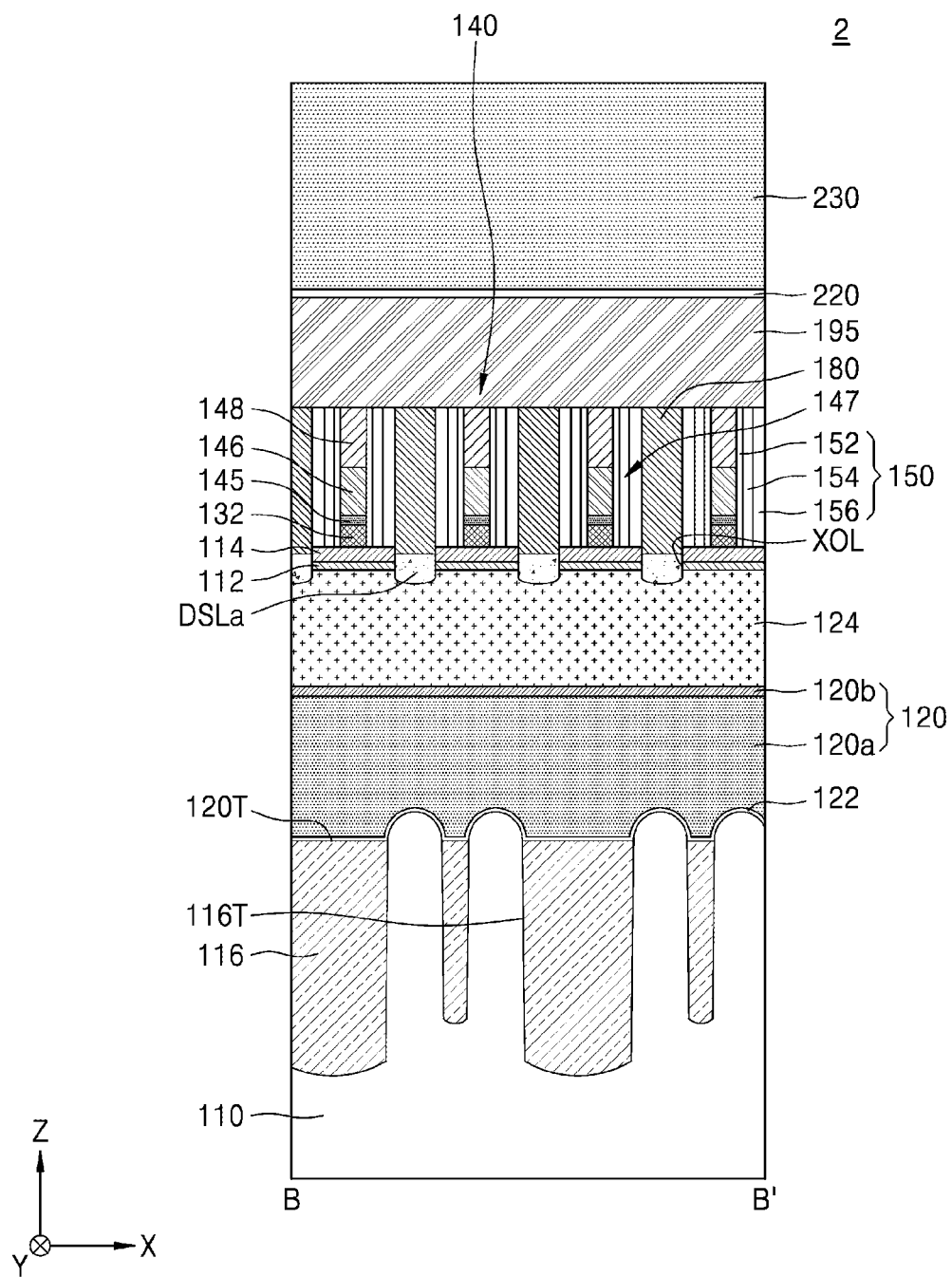

FIGS. 15A and 15B are cross-sectional views illustrating a method of manufacturing a semiconductor memory device, according to some embodiments, and FIGS. 16A and 16B are cross-sectional views illustrating semiconductor memory devices according to some embodiments. In detail, FIGS. 15A and 16A are each a cross-sectional view taken along a position corresponding to the line A-A' in FIG. 2, and FIGS. 15B and 16B are each a cross-sectional view taken along a position corresponding to the line B-B' of FIG. 2. In FIGS. 15A to 16B, the description already given in FIGS. 1 to 14D may be omitted.

Referring to FIGS. 15A and 15B together, a portion of the isolation insulating material layer DS shown in FIGS. 8, 9A, 9B, 9C, and 9D is removed to expose the second insulating layer pattern 114 and the plurality of active regions 118 to form an isolation insulating pattern DSPa. The isolation insulating pattern DSPa may be formed by removing a portion of the isolation insulating material layer DS, at least partially covering the upper surface of the second insulating layer pattern 114 that is an outside portion of the isolation trench XO and a portion that covers the active region 118 at the bottom of the hole trench portion XOH, that is, a portion of the isolation insulating material layer DS positioned on the lower surface of the recess portion DR.

The isolation insulating pattern DSPa may include an isolation insulating line portion DSLa at least partially filling a portion of the line trench portion XOL and an isolation insulating spacer portion DSSa at least partially covering the sidewall of the hole trench portion XOH. In the isolation insulating pattern DSPa, in a plan view, the isolation insulating line portion DSLa having a line shape extending in the second horizontal direction (Y direction) and the isolation insulating spacer portion DSSa having a ring shape may be connected to each other in the second horizontal direction (Y direction) and be alternately disposed. That is, the isolation insulating line portion DSLa and the isolation insulating spacer portion DSSa are disposed in every other isolation trench XO in a line in the second horizontal direction. In the first horizontal direction (X direction), the width of the isolation insulating spacer part DSSa may be greater than the width of the isolation insulating line part DSLa. Because the isolation insulating line portion DSLa and the isolation insulating spacer portion DSSa are resultant structures formed by removing a portion of the isolation insulating material layer DS shown in FIGS. 8, 9A, 9B, 9C, and 9D, they are connected to each other and form an integral or monolithic body.

In some embodiments, the isolation insulating material layer DS may have an etch characteristic similar to that of the second insulating layer pattern 114 with respect to an etching process for forming the isolation insulating pattern DSPa, but may have a slightly greater etch rate than the second insulating layer pattern 114. For example, the upper surface of the isolation insulating pattern DSPa may be positioned at a lower vertical level than the upper surface of the second insulating layer pattern 114.

The isolation insulating line unit DSLa may be interposed between the cell pad patterns XL adjacent in the first horizontal direction (X direction) to separate the cell pad patterns XL to be insulated from each other. The isolation insulating spacer part DSSa may at least partially cover the cell pad pattern XL, the first insulating layer pattern 112, and the second insulating layer pattern 114 exposed on sidewalls of the plurality of isolation trenches XO. The isolation insulating spacer portion DSSa at least partially surrounds conductive layer 130 for direct contact shown in FIGS. 12 and 13A, to separate the direct contact conductive pattern 130 to be insulated from the adjacent cell pad pattern XL.

Referring to FIGS. 16A and 16B together, a semiconductor memory device 2 includes a plurality of active regions 118 defined by a device isolation layer 116 and a plurality of cell pad patterns XL, and includes a substrate 110 having a plurality of word line trenches 120T crossing a plurality of active regions 118, a plurality of word lines 120 disposed inside the plurality of word line trenches 120T, a plurality of bit line structures 140, and a plurality of capacitor structures 200 including a plurality of lower electrodes 210, a capacitor dielectric layer 220, and an upper electrode 230.

In the plurality of isolation trenches XO, in a top-view, a line trench portion XOL having a line shape extending in a second horizontal direction (Y direction) and a hole trench portion XOH having a circular shape may communicate with each other and be alternately disposed in the second horizontal direction (Y direction). That is, the line trench portion XOL and the hole trench portion XOH are disposed in every other isolation trench XO in a line in the second horizontal direction.

The isolation insulating pattern DSPa may include the isolation insulating line part DSLa at least partially filling a portion of the line trench part XOL and the isolation insulating spacer part DSSa at least partially covering the sidewall of the hole trench part XOH. The isolation insulating line unit DSLa may be interposed between the cell pad patterns XL adjacent in the first horizontal direction (X direction) to separate the cell pad patterns XL to be insulated from each other. The upper surface of the isolation insulating pattern DSPa may be positioned at a lower vertical level than the upper surface of the second insulating layer pattern 114. The conductive semiconductor pattern 132 may extend into the line trench portion XOL to contact the isolation insulating line portion DSLa.

While the inventive concept has been particularly shown and described with reference to embodiments thereof, it will be understood that various changes in form and details may be made therein without departing from the spirit and scope of the following claims.

What is claimed is:

1. A semiconductor memory device comprising:
    a substrate having a plurality of active regions;
    a plurality of word lines formed in the substrate and respectively disposed in a plurality of word line trenches extending in a first direction;
    a plurality of cell pad patterns respectively on the plurality of active regions;
    a plurality of bit line structures formed on the substrate and extending in a second direction perpendicular to the first direction; and
    a plurality of isolation insulating patterns filling at least a portion of a plurality of isolation trenches extending between the plurality of cell pad patterns in the second direction,
    wherein each of the plurality of isolation insulating patterns comprises an isolation insulating line portion having a line shape and an isolation insulating spacer portion having a ring shape connected to each other and forming an integral body, the isolation insulating line portion and the isolation insulating spacer portion being disposed in alternating ones of the plurality of isolation trenches and extending in the second direction.

2. The semiconductor memory device of claim 1, wherein each of the plurality of isolation trenches comprises a line trench portion having a line shape and a hole trench portion having a circular shape, the line trench portion and the hole trench portion being alternately arranged in the second direction across the plurality of isolation trenches.

3. The semiconductor memory device of claim 2, wherein the isolation insulating line portion fills at least a portion of the line trench portion, and the isolation insulating spacer portion is on a sidewall of the hole trench portion.

4. The semiconductor memory device of claim 2, further comprising:
    a plurality of direct contact conductive patterns between the plurality of bit line structures and the plurality of active regions, wherein lower portions of the plurality of direct contact conductive patterns are located in the plurality of hole trench portions, respectively, and
    wherein the plurality of isolation insulating spacer portions at least partially surround the plurality of direct contact conductive patterns, respectively.

5. The semiconductor memory device of claim 4, wherein the plurality of isolation insulating spacer portions is between the plurality of direct contact conductive patterns and the plurality of cell pad patterns.

6. The semiconductor memory device of claim 2, wherein a thickness of the isolation insulating spacer portion on a sidewall of the hole trench portion has a value equal to or greater than ½ of a width of the line trench portion in the first direction and less than ½ of a width of the hole trench portion.

7. The semiconductor memory device of claim 2, wherein a width of the hole trench portion is greater than a width of the line trench portion, and a bottom surface of the hole trench portion is located at a lower level than a bottom surface of the line trench portion where the substrate provides a base reference level.

8. The semiconductor memory device of claim 1, wherein the plurality of cell pad patterns have a matrix arrangement arranged in a line in each of the first direction and the second direction.

9. The semiconductor memory device of claim 1, further comprising:
    a plurality of buried insulating layers on the plurality of word lines, respectively, and extending in the first direction,
    wherein upper surfaces of the plurality of buried insulating layers are positioned at substantially a same level as upper surfaces of the plurality of cell pad patterns where the substrate provides a base reference level.

10. The semiconductor memory device of claim 1, wherein, in a plan view, the cell pad pattern has a rectangular shape in which one side is concave.

11. A semiconductor memory device comprising:
    a substrate having a plurality of active regions;
    a plurality of word lines formed in the substrate and disposed in a plurality of word line trenches extending in a first direction and a plurality of buried insulating layers on the plurality of word lines;
    a plurality of cell pad patterns on the plurality of active regions;
    an insulating layer pattern on the plurality of buried insulating layers and the plurality of cell pad patterns;

a plurality of isolation insulating patterns filling at least a portion of a plurality of isolation trenches extending in a second direction perpendicular to the first direction between the plurality of cell pad patterns and the insulating layer pattern;

a plurality of bit line structures formed on the substrate and extending in the second direction; and a plurality of direct contact conductive patterns between the plurality of bit line structures and the plurality of active regions, wherein lower portions of the plurality of direct contact conductive patterns are located in the plurality of isolation trenches, respectively, wherein, each of the plurality of isolation insulating patterns comprises an isolation insulating line portion having a line shape and an isolation insulating spacer portion having a ring shape connected to each other and forming an integral body, the isolation insulating line portion and the isolation insulating spacer portion being disposed in alternating ones of the plurality of isolation trenches and extending in the second direction, and wherein the plurality of isolation insulating spacer portions at least partially surround the plurality of direct contact conductive patterns, respectively.

12. The semiconductor memory device of claim 11, wherein, in a plan view, each of the plurality of cell pad patterns has four sides, both sides of each of the plurality of cell pad patterns in the second direction have a linear shape extending in the first direction, one side of both sides of each of the plurality of cell pad patterns in the first direction has a linear shape extending in the second direction, and a other side of both sides of each of the plurality of cell pad patterns in the first direction has an inwardly concave arc shape.

13. The semiconductor memory device of claim 12, wherein, among the four sides of each of the plurality of cell pad patterns, the other side having the inwardly concave arc shape is in contact with a respective one of the plurality of isolation insulating spacer portions.

14. The semiconductor memory device of claim 11, wherein an upper surface of the isolation insulating pattern is located at a same level as an upper surface of the insulating layer pattern to form a coplanar surface.

15. The semiconductor memory device of claim 11, wherein an upper surface of the isolation insulating pattern is located at a lower level than an upper surface of the insulating layer pattern where the substrate provides a base reference level.

16. The semiconductor memory device of claim 11, wherein the plurality of isolation trenches are formed using an extreme ultraviolet (EUV) lithography process.

17. The semiconductor memory device of claim 11, wherein the plurality of cell pad patterns are separated and insulated from each other by the plurality of buried insulating layers and the plurality of isolation insulating patterns, and have a matrix arrangement arranged in a line in each of the first direction and the second direction.

18. A semiconductor memory device comprising:
a substrate having a plurality of active regions;
a plurality of word lines formed in the substrate and disposed in a plurality of word line trenches extending in a first direction and a plurality of buried insulating layers on the plurality of word lines;

a plurality of cell pad patterns on the plurality of active regions;

an insulating layer pattern on the plurality of buried insulating layers and the plurality of cell pad patterns;

a plurality of isolation insulating patterns filling at least a portion of a plurality of isolation trenches extending in a second direction perpendicular to the first direction between the plurality of cell pad patterns and the insulating layer pattern;

a plurality of bit line structures formed on the substrate and extending in the second direction;

a plurality of direct contact conductive patterns between the plurality of bit line structures and the plurality of active regions, wherein lower portions of the plurality of direct contact conductive patterns are located in the plurality of isolation trenches, respectively;

a plurality of landing pads in contact with the plurality of cell pad patterns and extending to an upper portion of any one of two adjacent bit line structures among the plurality of bit line structures; and a plurality of capacitor structures including a plurality of lower electrodes in contact with the plurality of landing pads, an upper electrode, and a capacitor dielectric layer interposed between the plurality of lower electrodes and the upper electrode, wherein, each of the plurality of isolation insulating patterns comprises an isolation insulating line portion having a line shape and an isolation insulating spacer portion having a ring shape connected to each other and forming an integral body, the isolation insulating line portion and the isolation insulating spacer portion being disposed in alternating ones of the plurality of isolation trenches and extending in the second direction, wherein the plurality of isolation insulating spacer portions at least partially surround the plurality of direct contact conductive patterns, respectively, and wherein the plurality of cell pad patterns are separated and insulated from each other by the plurality of buried insulating layers and the plurality of isolation insulating patterns.

19. The semiconductor memory device of claim 18, wherein the plurality of active regions have long axes in a diagonal direction with respect to the first direction and the second direction, and wherein on each of the plurality of active regions, a pair of the cell pad patterns among the plurality of cell pad patterns is disposed on both sides, respectively, in a diagonal direction.

20. The semiconductor memory device of claim 18, wherein, in a plan view, each of the plurality of cell pad patterns has four sides, and wherein three sides of four sides of each of the plurality of cell pad patterns have a straight line shape, and a other side has a circular arc shape concave inwardly in contact with a respective one of the plurality of isolation insulating spacer portions.

* * * * *